United States Patent
Hadzic et al.

(10) Patent No.: US 8,275,087 B2
(45) Date of Patent: Sep. 25, 2012

(54) FREQUENCY SYNCHRONIZATION USING FIRST AND SECOND FREQUENCY ERROR ESTIMATORS

(75) Inventors: Ilija Hadzic, Millington, NJ (US); Dennis Raymond Morgan, Morristown, NJ (US)

(73) Assignee: Alcatel Lucent, Paris (FR)

( * ) Notice: Subject to any disclaimer, the term of this patent is extended or adjusted under 35 U.S.C. 154(b) by 847 days.

(21) Appl. No.: 12/339,333

(22) Filed: Dec. 19, 2008

(65) Prior Publication Data

US 2010/0158183 A1 Jun. 24, 2010

(51) Int. Cl.
*H03D 3/24* (2006.01)
(52) U.S. Cl. ........ 375/376; 375/354; 375/359; 375/293; 331/17; 331/25; 370/335; 370/342
(58) Field of Classification Search .................... 375/376
See application file for complete search history.

(56) References Cited

U.S. PATENT DOCUMENTS

| | | | | |
|---|---|---|---|---|
| 5,942,949 | A | * | 8/1999 | Wilson et al. .................... 331/17 |
| 7,697,495 | B2 | * | 4/2010 | Armstrong et al. ............ 370/338 |
| 2003/0128678 | A1 | * | 7/2003 | Subrahmanya et al. ...... 370/335 |
| 2006/0222129 | A1 | | 10/2006 | Hadzic et al. |
| 2007/0083639 | A1 | * | 4/2007 | Gilbert et al. ................. 709/224 |
| 2007/0085579 | A1 | * | 4/2007 | Wallberg et al. .............. 327/156 |
| 2007/0120612 | A1 | * | 5/2007 | Fu ................................. 331/34 |

OTHER PUBLICATIONS

MEF8, Implementation Agreement for the Emulation of PDH Circuits over Metro Ethernet Networks, Metro Ethernet Forum, Oct. 2004, 34 pages.
A. Vainshtein et al., "Structure-Agnostic Time Division Multiplexing (TDM) Over Packet (SATOP)," IETF RFC 4553, Jun. 2006, pp. 1-27.
R.C. Lau et al., "Synchronous Techniques for Timing Recovery in BISDN," IEEE Transactions on Communications, Feb.-Mar.-Apr. 1995, pp. 1810-1818, vol. 43, No. 2-3-4.
D.L. Mills, "Network Time Protocol (Version 3) Specification, Implementation and Analysis," IETF RFC 1305, Mar. 1992, 120 pages.
I. Hadzic et al., "High Performance Synchronization for Circuit Emulation in an Ethernet MAN," Journal of Communications and Networks, Mar. 2005, pp. 1-12, vol. 7, No. 1, pp. 1-12.
ITU-T G.8261, "Timing and Synchronization Aspects in Packet Networks," International Telecommunication Union (ITU), Telecommunication Standardization Sector, May 2006, 64 pages.

(Continued)

*Primary Examiner* — Lihong Yu
(74) *Attorney, Agent, or Firm* — Ryan, Mason & Lewis, LLP

(57) ABSTRACT

An endpoint or other communication device of a communication system includes a clock recovery module. The communication device is operative as a slave device relative to another communication device that is operative as a master device. The clock recovery module comprises a clock recovery loop configured to control a slave clock frequency of the slave device so as to synchronize the slave clock frequency with a master clock frequency of the master device. The clock recovery loop comprises a primary loop having a first frequency error estimator for generating a first estimate of error between the master and slave clock frequencies, a second frequency error estimator outside of the primary loop for generating a second estimate of error between the master and slave clock frequencies, and an accumulator coupled between the second frequency error estimator and the primary loop. The second estimate is controllably injected into the primary loop via the accumulator.

18 Claims, 12 Drawing Sheets

OTHER PUBLICATIONS

J. Kim et al., "Design of CMOS Adaptive-Bandwidth PLL/DLLs: A General Approach," IEEE Transactions on Circuits and Systems II: Analog and Digital Signal Processing, Nov. 2003, pp. 860-869, vol. 50, No. 11.

ITU-T G.823, "The Control of Jitter and Wander within Digital Networks which are Based on the 2048 kbit/s Hierarchy," International Telecommunication Union (ITU), Telecommunication Standardization Sector, Mar. 2000, 50 pages.

ITU-T G.824, "The Control of Jitter and Wander within Digital Networks which are Based on the 1544 kbit/s Hierachy," International Telecommunication Union (ITU), Telecommunication Standardization Sector, Mar. 2000, 27 pages.

* cited by examiner

FREQUENCY SYNCHRONIZATION USING FIRST AND SECOND FREQUENCY ERROR ESTIMATORS

RELATED APPLICATIONS

The present application is related to commonly-assigned U.S. patent application Ser. No. 12/339,318, entitled "Method, Apparatus and System for Frequency Synchronization Between Devices Communicating Over a Packet Network," and Ser. No. 12/339,343, entitled "Frequency Synchronization with Compensation of Phase Error Accumulation Responsive to a Detected Discontinuity," both of which are filed concurrently herewith and incorporated by reference herein.

FIELD OF THE INVENTION

The present invention relates generally to communication systems, and more particularly to techniques for providing frequency synchronization between endpoint devices or other communication devices of such systems.

BACKGROUND OF THE INVENTION

Synchronous communication between endpoint devices such as data or voice transport using an International Telecommunications Union (ITU) Synchronous Digital Hierarchy (SDH) or Plesiochronous Digital Hierarchy (PDH) transmission system over an asynchronous packet network such as an Ethernet Transport and Access Network (EATN) or Metropolitan Ethernet Network (MEN) often requires that the devices have some mechanism for achieving frequency synchronization. One technique that allows transport of SDH or PDH links over a packet network is the Circuit Emulation Service (CES), in which bits from one or more consecutive TDM frames are encapsulated in an Ethernet packet. See, for example, MEF8, Implementation Agreement for the Emulation of PDH Circuits over Metro Ethernet Networks, Metro Ethernet Forum, October 2004, and IETF RFC 4553, A. Vainshtein and Y. J. Stein, "Structure-agnostic time division multiplexing (TDM) over packet (SATOP)," June 2006.

Similar synchronization requirements exist for wireless backhaul networks implemented over an EATN or MEN. In such wireless backhaul networks, radio frequencies must be synchronized to certain, often rigorous, precision levels and the synchronization requirement exists regardless of whether the endpoint devices are native packet-based devices or circuit-based devices.

Certain known frequency synchronization techniques utilize clock recovery based on differential timestamps. See, for example, R. C. Lau and P. E. Fleischer, "Synchronous techniques for timing recovery in BISDN," IEEE Transactions on Communications, vol. 43, no. 234, pp. 1810-1818, February-March-April 1995. Such differential clock recovery techniques may make use of a common reference clock if available. The common reference clock is typically a SONET/SDH clock (e.g., in ATM networks) or a clock sourced from Building Integrated Timing Supply (BITS) or Global Positioning System (GPS) timing systems. Although originally designed for ATM networks, differential clock recovery techniques apply to any packet network, such as Ethernet, as long as the common reference is available. The recent development of synchronous Ethernet will allow native Ethernet deployments to have access to a common reference clock.

The main advantage of differential clock recovery is its insensitivity to packet delay variation (PDV) within the packet network. However, not all installations have access to BITS or GPS timing systems, and deploying synchronous Ethernet generally requires a substantial upgrade of the packet network.

Adaptive clock recovery techniques are also known. Such techniques, often implemented together with the CES service, use packet arrivals as clock indications and thus do not require the above-noted common reference clock. However, adaptive clock recovery techniques are very sensitive to PDV. PDV can be reduced if CES packets are given strict priority at queuing points in the network using Quality of Service (QoS) assignments, but as the number of emulated circuits grows, CES flows start competing against each other, defeating the purpose of QoS. Also, the processing operations needed to handle multiple CES flows can consume excessive amounts of computational and memory resources on the endpoint devices. Adaptive clocking techniques are therefore not readily scalable, and fail to provide adequate performance in many situations.

SUMMARY OF THE INVENTION

The present invention in one or more illustrative embodiments provides improved techniques for frequency synchronization between communication devices.

In accordance with one aspect of the invention, a communication device comprises a clock recovery module. The communication device is operative as a slave device relative to another communication device that is operative as a master device. The clock recovery module comprises a clock recovery loop configured to control a slave clock frequency of the slave device so as to synchronize the slave clock frequency with a master clock frequency of the master device. The clock recovery loop comprises a primary loop having a first frequency error estimator configured to generate a first estimate of error between the master clock frequency and the slave clock frequency, a second frequency error estimator arranged outside of the primary loop and configured to generate a second estimate of error between the master clock frequency and the slave clock frequency, and an accumulator coupled between the second frequency error estimator and the primary loop. The second estimate is controllably injected into the primary loop via the accumulator.

In an illustrative embodiment, the first and second frequency error estimators independently generate the respective first and second estimates by processing arrival timestamps generated in the slave device for respective timing messages received from the master device.

The second estimate may be generated by the second frequency error estimator for a given sample and the second estimate generated for the given sample may be combined with an output of the accumulator from a previous sample prior to being injected into the primary loop at an output of the loop filter. The second estimate may be controllably injected into the primary loop only during a particular operating mode of the primary loop, such as an acquisition mode of the primary loop.

The second frequency error estimator may have a lower accuracy than that of the primary loop but a time constant that is substantially smaller than a time constant of the primary loop, such that the second frequency error estimator generates the second estimate before the primary loop converges to a steady state.

Advantageously, the illustrative embodiments can provide significantly improved performance in frequency synchronization relative to the conventional techniques previously described.

These and other features and advantages of the present invention will become more apparent from the accompanying drawings and the following detailed description.

DETAILED DESCRIPTION OF THE INVENTION

The present invention will be illustrated herein in conjunction with exemplary communication systems and associated techniques for frequency synchronization in such systems. It should be understood, however, that the invention is not limited to use with the particular types of communication systems and frequency synchronization processes disclosed. The invention can be implemented in a wide variety of other communication systems, using alternative processing circuitry arrangements and process steps. For example, although illustrated in the context of a communication system involving synchronous service over an asynchronous packet network such as an EATN or MEN, the disclosed techniques can be adapted in a straightforward manner to a variety of other types of communication systems, including cellular systems, WiMAX systems, Wi-Fi systems, multiple-input multiple-output (MIMO) wireless systems, etc.

Figure 1:
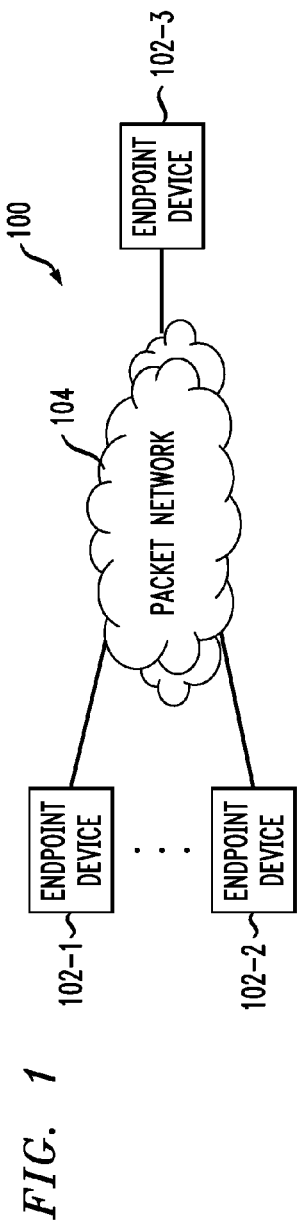
FIG. 1 is a block diagram of a communication system in an illustrative embodiment of the invention.

FIG. 1 shows a communication system 100 comprising a plurality of endpoint devices 102-1, 102-2 and 102-3 coupled to a packet network 104. A given endpoint device may comprise, for example, a computer, a wireless service base station, a mobile telephone, or any other type of communication device. One or more of the endpoint devices 102 are configured to incorporate a frequency synchronization functionality using a clock recovery loop as will be described in greater detail below. The particular number of endpoint devices shown in FIG. 1 is illustrative only and a given implementation may include more or fewer such devices. The packet network 104 is assumed to be an asynchronous packet network such as an Ethernet network. The network may or may not support QoS assignments. It may additionally or alternatively comprise other types of networks, in any combination.

Figure 2:
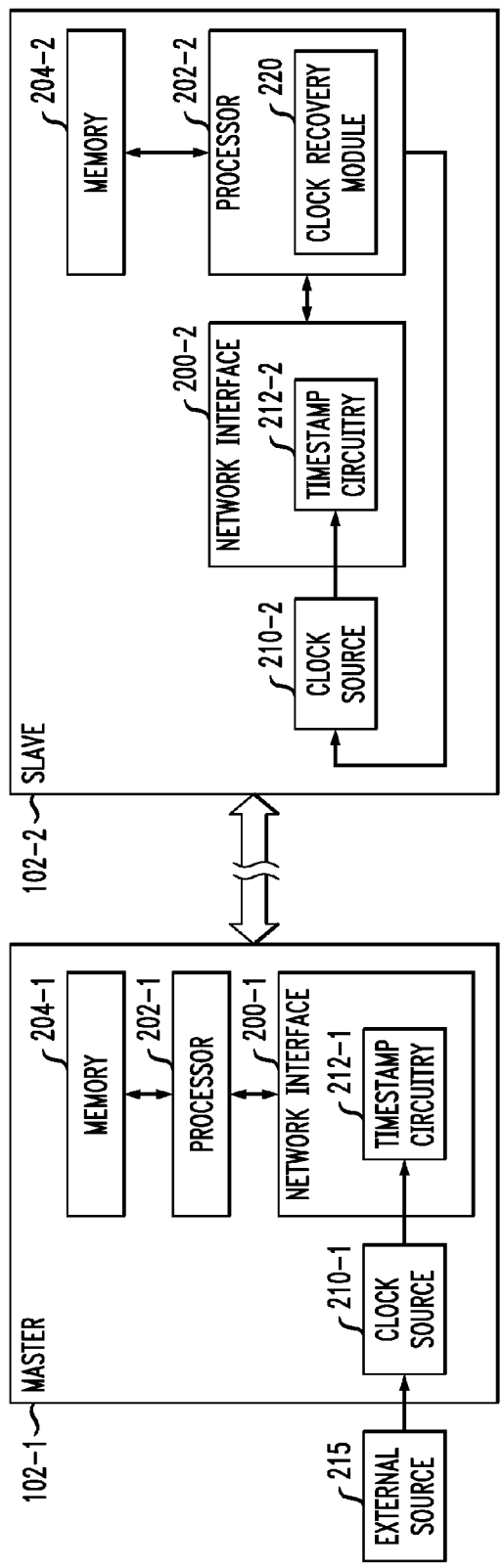
FIG. 2 shows a more detailed view of first and second communication devices in one possible implementation of the FIG. 1 system.

Frequency synchronization in the present embodiment is carried out between a pair of endpoint devices 102, one of which is designated as a master device and the other which is designated as a slave device. FIG. 2 shows a more detailed view of a given pair of endpoint devices 102-1 and 102-2 which are illustratively designated as master and slave, respectively. It should be noted that these designations are arbitrary, and a given endpoint device may operate as a master in one synchronization process and a slave in another synchronization process. Thus, each endpoint device may incorporate both master and slave functionality, with the particular functionality being selectable at run time. Alternatively, a particular endpoint device may include only master functionality or only slave functionality.

Each of the endpoint devices 102 as shown in FIG. 2 includes a network interface 200, a processor 202 coupled to the network interface, a memory 204 coupled to the processor, and a clock source 210 coupled to timestamp circuitry 212 of the network interface. The clock source 210 may comprise, for example, a local oscillator (LO). The reference numerals associated with these elements in FIG. 2 are further denoted with a dash number that denotes the particular endpoint device 102-1 or 102-2 in which the elements are implemented.

The endpoint devices 102-1 and 102-2 communicate with one another over the packet network 104 via their respective network interfaces 200. This communication may be via one or more intermediate communication devices, such as gateways, routers, switches or other network elements, internal to the packet network 104. The timestamp circuitry 212 of the network interfaces 200 generates timestamps for packets sent and received over the interfaces. Each of the network interfaces may include additional hardware elements not explicitly shown in the figure, such as transceivers, packet parsing circuitry, packet generation circuitry, packet editing circuitry, etc.

The clock source 210-1 of the master endpoint device 102-1 is coupled to an external source 215 which may comprise a SONET/SDH, BITS or GPS clock source or any other type of external clock source. The external clock source is typically, but not necessarily, traceable to a primary reference source such as an atomic clock. In other embodiments, the master endpoint device could be based on a free-running clock, which may itself be a primary reference clock such as an atomic clock, in which case the external source may be eliminated.

The slave endpoint device 102-2 comprises a clock recovery module 220 that is illustratively shown as being implemented by the processor 202-2. The clock recovery module comprises a clock recovery loop, detailed examples of which will be described below in conjunction with FIGS. 4A, 4B, 7A and 7B. In this particular embodiment, the clock recovery module is assumed to be implemented primarily in the form of software that is executed by the processor. Instruction code associated with such software may be stored in the memory 204-2, which is an example of what is more generally referred to herein as a "processor-readable storage medium." In other embodiments, the clock recovery module, or particular portions thereof, may be implemented primarily in hardware that resides outside of the processor, or in various combinations of hardware, firmware and software.

Although shown as separate elements in FIG. 2, the clock recovery module 220 may comprise clock source 210-2 as an internal element thereof. As will be described below, at least a portion of the clock source is generally arranged within a clock recovery loop, all other elements of which may be implemented primarily using processor 202-2. It is also possible that clock source 210-2 or portions thereof may be arranged internal to processor 202-2. Accordingly, the particular arrangement shown in FIG. 2 should be considered an illustrative example, and not limiting in any way.

The clock recovery module 220 may further comprise, for example, at least one discontinuity detector configured to detect a discontinuity in delays of respective timing messages, and a loop controller operative to place the clock recovery loop in a particular state responsive to detection of the discontinuity. Thus, the various discontinuity detectors and associated loop control elements as described herein may be implemented, for example, at least in part in the form of software executed by the processor 202-2. Alternatively, such discontinuity detection and loop controller elements may be implemented in the form of signal processing circuitry, logic circuitry or other hardware circuitry of the processor 202-2. Portions of the processor may therefore correspond to discontinuity detectors and loop controllers as described herein.

Although illustrated using endpoint devices 102, the frequency synchronization techniques disclosed herein can additionally or alternatively be implemented in one or more communication devices that are internal to the packet network 104.

As indicated above, each of the endpoint devices 102 may be viewed as an example of a communication device. This term as used herein is intended to be construed broadly, so as to encompass, by way of example and without limitation, any arrangement involving the exchange of information between two elements of a system without regard to the particular application, medium, etc. Accordingly, a device which is utilized, for example, in the exchange of data between two boards connected over a backplane is considered a communication device as that term is used herein.

A communication device in accordance with the invention may be implemented in the form of one or more integrated circuits. For example, in one possible implementation, the communication device may comprise a single application-specific integrated circuit (ASIC) which includes at least a processor, a memory and a network interface. As another example, the processor and memory may be on one integrated circuit, and the network interface on another. Numerous other single or multiple integrated circuit arrangements may be used in implementing the invention, and all such arrangements are intended to be encompassed by the general term "communication device" as used herein. A given such communication device can also be implemented at least in part using reconfigurable hardware, such as a field-programmable gate array (FPGA).

Figure 3:
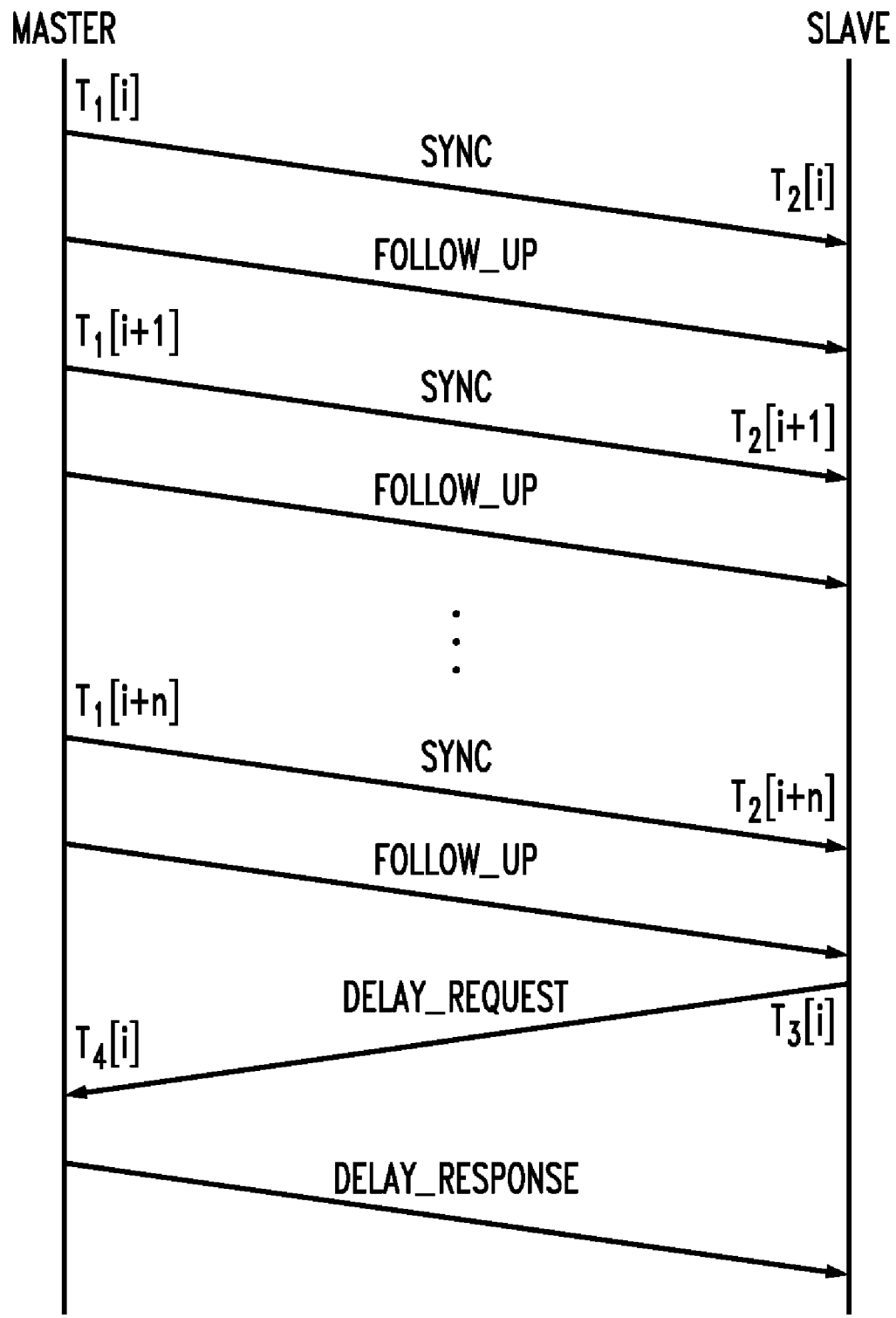
FIG. 3 illustrates a communication protocol that may be carried out between the first and second communication devices of FIG. 2.

FIG. 3 shows exemplary timing messages that may be exchanged between the master and slave endpoint devices 102-1 and 102-2 in an embodiment of the invention. The messages in this embodiment are compliant with the Precision Time Protocol (PTP) described in IEEE Draft P1588/D2.2, "Draft standard for a precision clock synchronization protocol for networked measurement and control systems," December 2007, which is incorporated by reference herein. This protocol is also commonly referred to as the IEEE1588v2 protocol. The corresponding timing messages are sent in the form of packets, although other types of timing messages may be used in implementing the invention.

In accordance with the protocol, the master device 102-1 periodically sends SYNC and possibly FOLLOW_UP messages to the slave device 102-2 as shown. A departure timestamp $T_1$ is generated by the timestamp circuitry 212-1 of the master device each time that device sends a SYNC message. When a given SYNC message is received by the slave device, its timestamp circuitry 212-2 generates a corresponding arrival timestamp $T_2$. The slave device can read the timestamp $T_1$ either directly from the given SYNC message or from the associated FOLLOW_UP message. The latter is an optional feature that exists to facilitate master device implementations in which hardware cannot directly edit the timestamp while the packet transmission is in progress. After some specified number of SYNC messages are received, the slave device generates a DELAY_REQUEST message and its departure timestamp $T_3$. Arrival timestamp $T_4$ is recorded at the master device and sent back to the slave device in a DELAY_RESPONSE message.

Particular timing messages in the protocol as illustrated in FIG. 3 are further identified using a sequence number or index. Thus, the timestamps $T_1$ and $T_2$ associated with SYNC message i are denoted $T_1[i]$ and $T_2[i]$, respectively. Similarly, the timestamps associated with DELAY_REQUEST message i are denoted $T_3[i]$ and $T_4[i]$, respectively.

The timestamps $T_1$ and $T_4$ are generated with reference to the clock 210-1 of the master device 102-1, while the timestamps $T_2$ and $T_3$ are generated with reference to the clock 210-2 of the slave device 102-2. Hence, simple arithmetic on these timestamps can yield a frequency error estimate. As will be described, this frequency error estimate is utilized in the clock recovery loops of FIGS. 4A and 7A.

It should be understood that although the description of the invention that follows will refer to SYNC messages of the PTP protocol and thus imply the use of $T_1$ and $T_2$ timestamps, all aspects of the present invention are applicable if the DELAY_REQUEST (and the associated DELAY_RESPONSE) messages are used instead (i.e., timestamps $T_3$ and $T_4$ are used instead of $T_1$ and $T_2$). It should also be apparent to those skilled in the art that the use of FOLLOW_UP messages does not change any aspect of the present invention.

It should be further understood that the present invention does not require the use of PTP, and can be implemented using a wide variety of other types of protocols designed for timing distribution. For example, the frequency synchronization techniques described herein can be adapted in a straightforward manner to utilize timing messages compliant with the Network Time Protocol (NTP) instead of PTP. NTP is described in D. L. Mills, "Network time protocol (version 3) specification, implementation and analysis," IETF RFC 1305, March 1992, which is incorporated by reference herein. Also, certain aspects of the invention can be adapted in a straightforward manner for use within an adaptive clocking system of a Circuit Emulation Service (CES), although the computational complexity may be an issue if too many CES flows concurrently exist in the network.

Basic Clock Recovery Loop

Figure 4A:
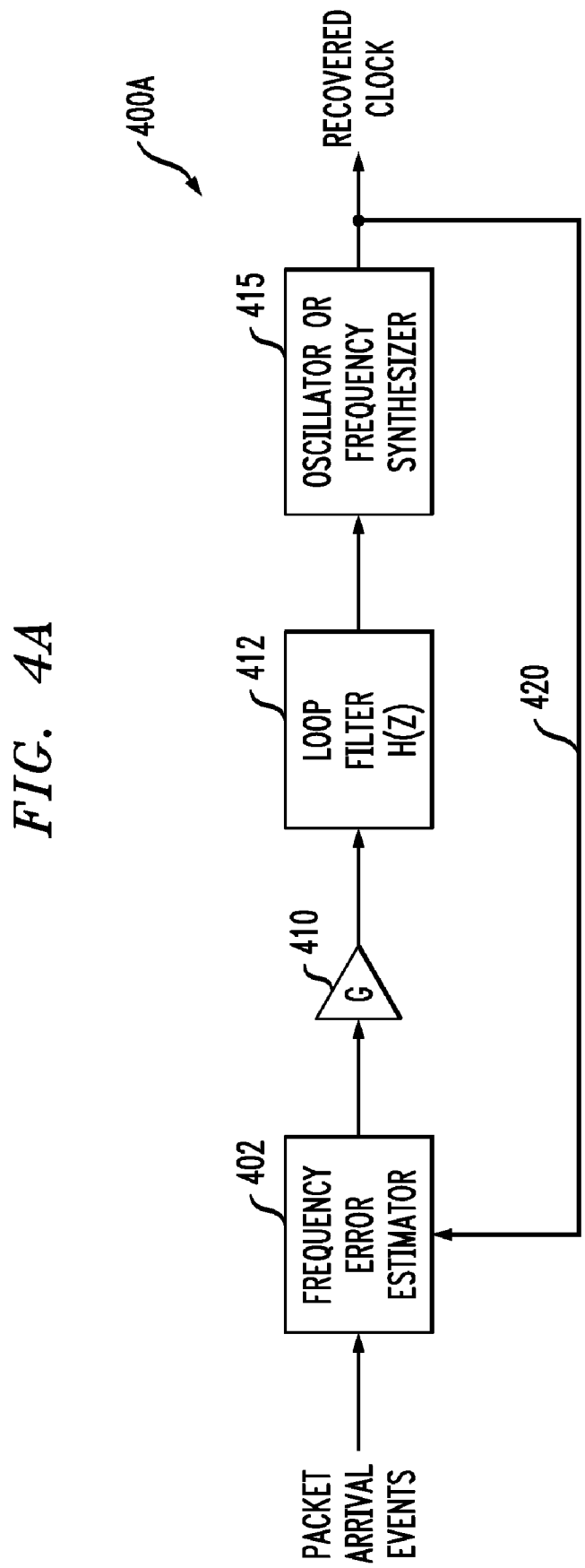
FIG. 4A is a block diagram of first illustrative embodiment of a clock recovery loop implemented in a given one of the communication devices of FIG. 2.

FIG. 4A shows a clock recovery loop 400A that is implemented primarily in the clock recovery module 220 of the slave endpoint device 102-2 in an illustrative embodiment. The clock recovery loop 400A includes a frequency error estimator 402, a gain stage 410, a loop filter 412, and a controllable oscillator or frequency synthesizer 415. A recovered clock generated as an output of the clock recovery loop 400A is fed back to the frequency error estimator 402 via feedback path 420 as indicated.

Generally, substantially all elements of the clock recovery loop 400A are implemented in clock recovery module 220 in the present embodiment, with the possible exception of the controllable oscillator or frequency synthesizer 415 which is associated with the slave device clock source 210-2. However, the term "clock recovery module" as used herein is intended to be more broadly construed, and may encompass at least a portion of controllable oscillator or frequency synthesizer 415, or other type of slave device clock source. Thus, as indicated previously, the clock recovery module may alternatively be viewed as comprising clock source 210-2 as an internal element of the module. Also, the term "clock recovery loop" as used herein is intended to be broadly construed to encompass a grouping of elements comprising substantially all loop elements other than a clock source that is controlled by the loop. It is to be appreciated that a clock recovery loop is utilized to control an associated clock source that is inserted within the loop.

Incoming packet arrival events, which may comprise received SYNC messages or other types of timing messages, are applied as inputs to the frequency error estimator 402. The frequency error estimator 402 uses these received timing messages and the recovered clock fed back from the output of the loop to generate an estimate of the error between the master device clock frequency and the slave device clock frequency. Timing information may be contained both in the packet content (e.g., a departure timestamp) and the event that signifies the packet arrival.

The controllable oscillator or frequency synthesizer 415 may be implemented, for example, as a voltage controlled oscillator (VCO) or other type of controllable local oscillator (LO). Alternatively, it may be implemented as a frequency synthesizer such as a circuit performing direct digital synthesis (DDS) based on a free-running local reference or any other component that allows an output frequency to be synthesized based on numerical information produced by the loop filter 412. The controllable oscillator or frequency synthesizer 415 may be viewed as an example of what is more generally referred to herein as a slave device clock source, or may comprise a portion of such a slave device clock source. Element 415 is also generally referred to herein as a controllable clock source. Although this element will also be more specifically referred to herein in certain contexts as simply an "oscillator," it should be understood that any of a variety of other clock sources may be used in implementing a given embodiment of the invention.

The clock recovery loop 400A in the present embodiment is generally configured as a phase-locked loop (PLL) operative to control a slave clock frequency of the slave endpoint device 102-2 based on a frequency error estimate generated by the frequency error estimator 402 so as to synchronize the slave clock frequency with a master clock frequency of the master endpoint device 102-1. As indicated previously, the frequency error estimator 402 processes timestamps such as those described in conjunction with FIG. 3 in order to generate the frequency error estimate. The PLL utilizes the frequency error estimate to control an output frequency of oscillator 415 which is assumed to be implemented in the clock source 210-2 of the slave endpoint device.

The timing messages that traverse the packet network 104 between master endpoint device 102-1 and slave endpoint device 102-2 are subject to packet delay variation (PDV). The PDV may exhibit jumps or other discontinuities due to factors such as route changes through the network, sudden changes in network traffic load, or other phenomena that are commonly associated with packet networks. The clock recovery loop 400A may be configured in a given embodiment to facilitate the provision of frequency synchronization in the presence of such discontinuities.

Figure 4B:
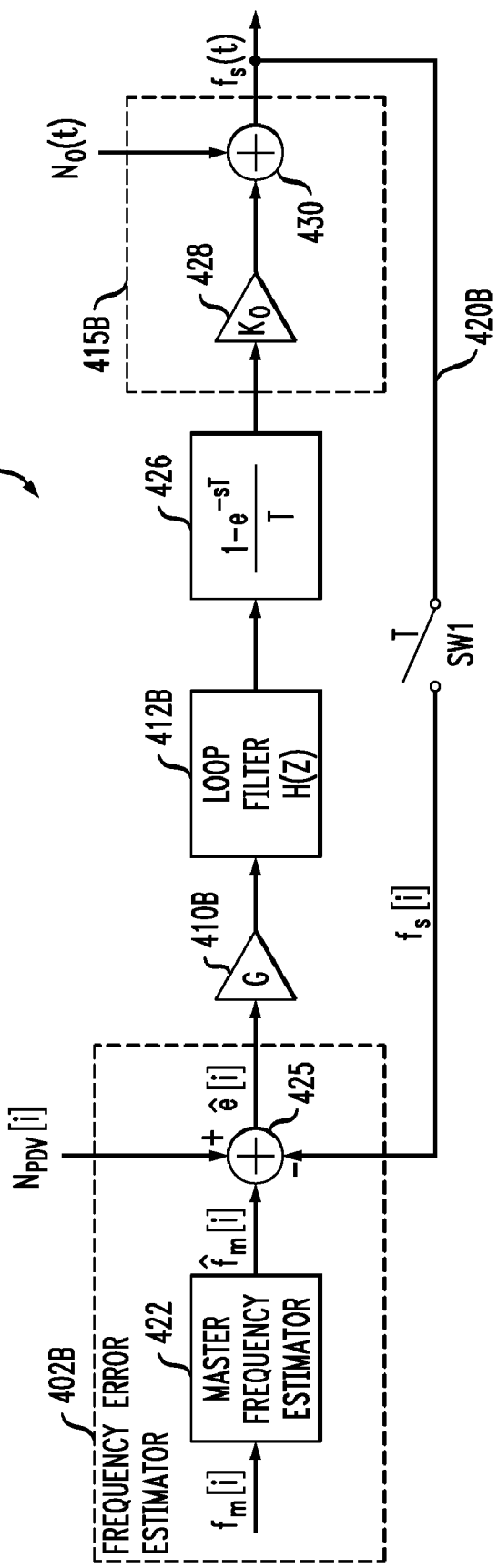
FIG. 4B is a mathematical model of the clock recovery loop of FIG. 4A.

FIG. 4B shows an exemplary mathematical model 400B of the clock recovery loop 400A of FIG. 4A. Elements present in the clock recovery loop 400A that are also present in the mathematical model are denoted in FIG. 4B using similar reference numerals. Thus, frequency error estimator 402, gain stage 410, loop filter 412, controllable clock source 415 and feedback path 420 of FIG. 4A are denoted as corresponding elements 402B, 410B, 412B, 415B and 420B in FIG. 4B. The mathematical model also shows a number of additional elements, as will be described in greater detail below. It is to be appreciated that these additional elements need not be present in a given physical implementation of the clock recovery loop, but are instead illustrated in order to facilitate an understanding of the operation of the loop. However, the model is also in the form of a clock recovery loop, and various elements thereof not shown in FIG. 4A may be present in a given embodiment of the invention.

The frequency error estimator 402B is modeled in this example as a series combination of a master frequency error estimator 422 and a signal combiner 425. Noise attributable to PDV of the received timing messages is modeled as an additive signal $N_{PDV}[i]$ applied to an input of the signal combiner 425.

A frequency error estimate $ê[i]$ generated by the frequency error estimator 402B is fed into the gain stage 410B and the loop filter 412B. Since packet arrivals events are discrete events, the clock recovery loop up to the output of the loop filter 412B is modeled as a discrete-time system. However, the oscillator 415B is a continuous-time block, so the transition from the discrete-time domain to the continuous-time domain is modeled in FIG. 4B using a zero-order hold block 426. More specifically, when the loop filter 412B produces an output, the signal value is held constant until the next packet arrives causing the loop to produce the next update. The oscillator 415B is modeled as a linear gain 428 to whose output the local drift and wander are added through a signal combiner 430.

As the frequency error estimator 402B is a discrete-time element triggered by packet arrival events, the transition from the continuous-time domain at the loop output back into the discrete-time domain is modeled by sampling switch SW1 in feedback path 420B. The switch SW1 is thus a mathematical representation of the fact that the frequency at the output of the clock recovery loop changes continuously but is only observed by the frequency error estimator 402B when a given packet arrives.

We denote as $f_m[i]$ and $f_s[i]$ the respective clock frequencies of the master and slave devices 102-1 and 102-2. As indicated above, the clock recovery loop 400A is generally configured to synchronize the slave frequency $f_s[i]$ with the master frequency $f_m[i]$. We further define $T_m[i]=1/f_m[i]$ and $T_s[i]=1/f_s[i]$ as the respective master and slave clock periods indexed to the SYNC messages previously described. These clock periods are discrete time functions, whose sampling rate is determined by the SYNC message rate. It should again be noted that other embodiments may utilize timing messages other than SYNC messages, such as DELAY_REQUEST messages, or similar pairs of timestamps in NTP or other timing distribution protocols.

Let $N_m[i]$ and $N_s[i]$ denote values of timestamps expressed in clock ticks generated at the SYNC message departure and arrival times. The first timestamp is carried in the payload of the SYNC message and is generated with reference to the master device clock 210-1. The second timestamp is generated at the SYNC message arrival with reference to the slave device clock 210-2. The timestamps $N_m[i]$ and $N_s[i]$ correspond generally to PTP timestamps $T_1$ and $T_2$ as previously described in conjunction with FIG. 3, but for convenience are expressed here in units of clock ticks instead of the units defined by the protocol. The master and slave timestamps $N_m[i]$ and $N_s[i]$ are assumed to be generated by the counters based on their respective clocks. Since the two counters generally start up at different times, their absolute values are offset by a constant delay d. We further define $\delta_m[i]$ and $\delta_s[i]$ as discrete time differentials of $N_m[i]$ and $N_s[i]$ respectively, that is, $\delta_m[i]=N_m[i]-N_m[i-1]$ and $\delta_s[i]=N_s[i]-N_s[i-1]$. The network delay is modeled as a sum of a constant component T and a PDV component represented as a zero-mean random variable $\tau[i]$. Its discrete time differential $\tau'[i]=\tau[i]-\tau[i-1]$ is called the network jitter.

From the above-defined parameters and the timing message diagram of FIG. 3, it is apparent that the following equation holds:

$$N_s[i]T_s[i] - (N_m[i]-d)T_m[i] = T + \tau[i]. \quad (1)$$

If the master and slave frequencies change slowly, then $T_m[i] \approx T_m[i-1]$ and $T_s[i] \approx T_s[i-1]$, and discrete time differentiation of (1) yields $$\delta_s[i]T_s[i] - \delta_m[i]T_m[i] = \tau'[i]. \quad (2)$$

Assuming for simplicity and clarity of description that the PDV has a zero-mean Gaussian distribution with standard deviation σ and no correlation in time, it follows that its discrete differential $\tau'$ has a Gaussian distribution with variance $2\sigma^2$. Based on this assumption and defining the noisy estimate of the master clock period as $\hat{T}_m[i]$, the likelihood function follows from (2):

$$\Lambda\left(\delta_s[i]T_s[i] \mid S_m[i]\hat{T}_m[i]\right) = \frac{1}{\sqrt{2\pi}\sqrt{2}\,\sigma} e^{-\frac{1}{4\sigma^2}(\delta_s[i]T_s[i]-\delta_m[i]\hat{T}_m)^2}. \quad (3)$$

This function has a maximum when $$\frac{\hat{T}_m[i]}{T_s[i]} = \frac{\delta_s[i]}{\delta_m[i]}. \quad (4)$$

Defining the normalized frequency error estimate and substituting (4) into it yields $$\hat{e}[i] = \frac{\hat{f}_m[i]-f_s[i]}{\hat{f}_m[i]} = 1 - \frac{\hat{T}_m[i]}{T_s[i]} = 1 - \frac{\delta_s[i]}{\delta_m[i]}. \quad (5)$$

The frequency error estimate of (5) is a noisy estimate and it is of interest to understand the properties of the noise and possible ways to reduce it. The noise component of the estimate is proportional to the network jitter, which can be shown by combining (2) and (4):

$$\hat{T}_m[i] = T_m[i] + \frac{\tau'[i]}{\delta_m[i]}. \quad (6)$$

By definition, $\tau[i]$ is zero-mean, and any bias is embedded in the constant component of the delay T. We also assume that the noise samples are uncorrelated in time. The rationale for this assumption is that there are so many background packets between two SYNC messages that any memory in the random process determined by the network impairments is erased by the time the next SYNC message is transmitted. Traces we collected by network simulations are consistent with this assumption.

Because the noise samples are assumed to be uncorrelated in time, the spectrum of the PDV component τ is white. The network jitter $\tau'$ generally has a high-pass spectrum and thus one way to reduce the noise is to run the incoming timestamps through a low-pass filter of a very narrow bandwidth before calculating the differential. See, for example, I. Hadzic and E. S. Szurkowski, "High performance synchronization for circuit emulation in an Ethernet MAN," Journal of Communications and Networks, vol. 7, no. 1, pp. 1-12, March 2005, which is incorporated by reference herein.

One possible implementation of the low-pass filter is linear regression fitting of a straight line through a set of points defined by the last M sequence numbers and timestamps. The slope of the fitted line approximates the differential $\delta_s[i]$. This linear regression is a form of a finite impulse response (FIR) low-pass filter.

An additional benefit of linear regression is that it inherently handles packet losses. Namely, if a packet is lost, there is a gap in the sequence number and a proportional gap in the timestamp differential. When plotted, the gap looks like a missing element in a set of points that forms a linear trend and the linear regression formula performs an interpolation. The taps of the FIR filter automatically adjust to account for the missing packet.

We define an operator $\text{slope}_{k=0}^{M-1}(.)$ as the slope of the line that is the best fit, in the minimum-square-error sense, for last M sequence numbers and timestamps. We then modify (5) to use this slope instead of the two-point differential:

$$\hat{e}[i] = 1 - \frac{\text{slope}_{k=0}^{M-1}(N_s[i-k])}{\delta_m[i]}. \quad (7)$$

Finally, we use (7) to drive the gain stage 410 and loop filter 412 and thereby control the oscillator 415.

In alternative embodiments, other types of slope fitting may be used. Thus, the slope fitting need not utilize the above-noted linear regression, which determines a best fit in a minimum-mean-square-error sense. Instead, the slope fitting may be based, for example, on minimizing median square error rather than mean square error, fitting such that the error is always one sign, etc.

A number of more specific slope fitting variants of equation (7) will now be described. All of these variants result in a usable estimate of the frequency error. In a first variant, the denominator in (7) is also the $\text{slope}_{k=0}^{M-1}(.)$ operator except that it uses the master timestamps $N_m$ in the argument:

$$\hat{e}[i] = 1 - \frac{\text{slope}_{k=0}^{M-1}(N_s[i-k])}{\text{slope}_{k=0}^{M-1}(N_m[i-k])}.$$

Such a variant is useful, for example, when the master packet departure timestamps are randomized around a stable mean.

In a second variant, instead of using the actual $\delta_m[i]$ in the denominator of (7), one could use a nominal constant value:

$$\hat{e}[i] = 1 - \frac{\text{slope}_{k=0}^{M-1}(N_s[i-k])}{\delta_m^{nominal}}.$$

This variant is appropriate if, for example, the master departure timestamps fall on a nominal grid with very little noise or variable delay.

The third variant is a further variation of the second. In this variant, the master departure timestamps are examined and subtracted from the values that they would have had if they departed in accordance with the nominal grid. Such values are known because the nominal departure rate is known and the master clock is assumed to be a stable clock to which all measurements are referenced. The actual master departure timestamps $N_m[i]$ are then subtracted from the predicted values to yield a correction. The correction is applied to the slave arrival timestamps $N_s[i]$ to yield corrected slave timestamps, and the error estimate is calculated using the corrected timestamps as the argument of the slope operator in the numerator and the nominal constant value in place of the actual $\delta_m[i]$ in the denominator. The resulting modified equation is given by:

$$\hat{e}[i] = 1 - \frac{slope_{k=0}^{M-1}(\overline{N}_s[i-k])}{\delta_m^{nominal}},$$

where $\overline{N}_s[i]$ denotes the corrected slave timestamps. This variant achieves an effect similar to that of the first variant above, and is effective for randomized departure timestamps, but requires less computational effort.

The clock recovery loop 400A may be generally viewed as providing a feedback control system configured to track the master device clock frequency as accurately as possible in the face of various sources of disturbance. On each SYNC message arrival, the frequency error estimator 402 produces a sample and the loop code executes. Hence, the system is natively discrete with a variable sample rate that averages the SYNC message arrival rate. Once the oscillator update is calculated, it is used to drive the oscillator 415 until the next packet arrival, which is modeled in FIG. 4B with the zero-order hold 426. The output frequency $f_s(t)$ is a continuous signal that drives a counter used to produce $\delta_s$, and is sampled on the next packet arrival. As indicated previously, this is modeled in FIG. 4B by the switch SW1 which samples $f_s(t)$ in the feedback path 422B. The loop gain in the model 400B is the product of the oscillator constant $K_o$ associated with element 428 and the gain G of gain stage 410B.

The first and dominant form of disturbance is the PDV noise modeled as $N_{PDV}[i]$ in FIG. 4B. Starting from (5), and assuming that the time between two consecutive SYNC messages is constant and equals $\Delta T_1$, the frequency error estimate can be written as $$\hat{e}[i] \approx 1 - \frac{(\Delta T_1 + \tau'[i]) \cdot f_s[i]}{\Delta T_1 \cdot f_m[i]} \approx \frac{f_m[i] - f_s[i]}{f_m[i]} - \frac{\tau'[i]}{\Delta T_1}. \quad (8)$$

The first term represents the useful signal and equals the relative offset between the recovered slave clock frequency and the master clock frequency. At loop startup, this error is typically between a few hundred parts per billion (PPB) and a few parts per million (PPM). The second term is the additive noise and is roughly equal to the PDV relative to the nominal SYNC message departure period. Hence, the signal-to-noise ratio (SNR) is $$SNR[\text{dB}] \approx 10 \cdot \log\left(\frac{f_m[i] - f_s[i]}{f_m[i]} \cdot \frac{\Delta T_1}{\tau'[i]}\right) \quad (9)$$

Assuming 200 µs PDV, 60 ms SYNC message departure time, and a 100 PPB recovered clock offset, the SNR is −45 dB. Furthermore, in a converged state, the recovered clock is typically less than 5 PPB off from the master clock, which brings the SNR down by another order of magnitude. Such a low SNR represents a considerable challenge in designing a clock recovery loop that meets the rigorous performance requirements of standards such as ITU-T G.8261, "Timing and Synchronization Aspects in Packet Networks," International Telecommunication Union (ITU), Telecommunication Standardization Sector, May 2006, which is incorporated by reference herein.

Besides the extremely low SNR, we also note that the noise is inserted at the input to the loop, so the loop filter 412B does not provide any noise suppression other than attenuating the high frequency components, due to its low-pass nature. This is in contrast to noise $N_O(t)$ of the oscillator 415B, which is inserted after the loop filter 412B via signal combiner 430 and thus is suppressed proportionally to the loop gain. The noise $N_O(t)$ represents an aggregate of disturbances that impact the oscillator, such as thermal noise, temperature wander and systematic drift due to aging. The systematic drift typically resembles a ramp function and can be handled by using two integrators in the loop (i.e., a type-2 system), while the thermal noise can be suppressed by sufficiently high loop gain. See, for example, C. L. Phillips and H. T. Nagle, Digital Control Systems, Analysis and Design, 2nd ed. Prentice Hall, 1990, ch. 6, pp. 186-220, which is incorporated by reference herein.

The temperature wander of the oscillator 415B is a slow variation of the output frequency due to temperature variations. Spectral components of the temperature wander are typically in the sub-hertz region. Depending on the type of oscillator used, the magnitude can vary between a few PPB and a few PPM. For a PLL to be able to track the wander, the bandwidth of the loop filter needs to be sufficiently wide. However, in order to manage the noise due to PDV, the loop filter should have a narrow bandwidth.

Hence, we have two opposing requirements on the loop filter 412, in that to suppress the PDV noise, the loop bandwidth should be narrow, while tracking of the temperature wander typically requires a wide loop bandwidth. Also, the loop must be stable and must have a reasonable convergence time.

The loop filter 412 in the embodiment of FIG. 4A is configured to meet the above-noted requirements by using a cascade of a discrete-time trapezoidal integrator, a single-pole adaptive-bandwidth low-pass filter, and a proportional-integral (PI) controller:

$$H(z) = \frac{1}{2} \cdot \frac{1+z^{-1}}{1-z^{-1}} \cdot \frac{\alpha}{1-(1-\alpha)z^{-1}} \cdot \left[\frac{K_i}{2} \cdot \frac{1+z^{-1}}{1-z^{-1}} + (1-K_i)\right]. \quad (10)$$

where $K_i$ is the integrator constant of the integrator in the PI controller and $\alpha$ is a so-called "forgetting factor" of the adaptive-bandwidth low-pass filter.

The purpose of having two integrators in the loop is to ensure tracking of the systematic drift with no error. The proportional component of the PI controller is used to stabilize the loop because type-2 systems are inherently unstable. See, for example, J. Kin, M. A. Horowitz, and G.-Y. Wei, "Design of CMOS adaptive-bandwidth PLL/DLLs: A general approach," IEEE Transactions on Circuits and Systems II: Analog and Digital Signal Processing, vol. 50, no. 11, pp. 860-869, November 2003, which is incorporated by reference herein.

All of the components of the loop filter 412 may be implemented by performing calculations in software. Notice that because the frequency error estimator 402 as described above compares the frequencies, not the phase, we have to explicitly implement the integration. Hence, the output of the first integrator, which corresponds to the first term in (10), is the signal generally known in PLL theory as the phase error ($\phi_e$). Nominally, this signal converges to zero as the loop settles, but systematic drift of the oscillator may cause it to converge to a small non-zero value.

The low-pass filter, corresponding to the second term in (10), is added to further narrow down the loop bandwidth and provide better PDV suppression properties. The filter is adaptive, that is, the loop starts the convergence process with wide filter bandwidth and narrows it down as the loop approaches steady state. We achieve this by making the forgetting factor $\alpha$ smaller as the phase error $\phi_e$ approaches zero, following the linear law $$\alpha = \begin{cases} \alpha^{min}, & |\hat{\phi}_e| \le \phi_e^{min} \\ \alpha^{max}, & |\hat{\phi}_e| \ge \phi_e^{max} \\ \alpha^{min} + \frac{\alpha^{max} - \alpha^{min}}{\phi_e^{max} - \phi_e^{min}} \cdot (|\hat{\phi}_e| - \phi_e^{min}), & \text{otherwise,} \end{cases} \quad (11)$$

where $\hat{\phi}_e$ is the signal produced by passing $\phi_e$ through a first-order low-pass filter with the forgetting factor set to a predetermined value, such as, for example, 0.99. Selecting the values of the loop gain $K_o \cdot G$, integration constant $K_i$ and corner points of (11) is a tradeoff between system stability margin, convergence time, and noise suppression.

It should be noted that the configuration of loop filter 412 as described above is presented by way of illustrative example only. In other embodiments, for example, the form of one or both of the discrete time integration functions in (10) may be changed from the trapezoidal integration form to the rectangular integration form:

$$\frac{1}{2} \cdot \frac{1+z^{-1}}{1-z^{-1}} \Longrightarrow \frac{1}{1-z^{-1}}.$$

Other types of alternative integrator functions may be used. Also, other series combinations of an adaptive-bandwidth filter and a PI controller may be used. For example, the adaptive-bandwidth filter may comprise a multiple-pole filter rather than a single-pole filter as in the illustrative embodiment of (10). The adaptive-bandwidth filter generally has a bandwidth that starts at a relatively wide value when the loop begins its convergence process and then subsequently narrows as the loop converges to a steady state, although it is possible to use other type of bandwidth adaptation.

It is also possible to eliminate the adaptive-bandwidth filter altogether in a given embodiment. This may be achieved, for example, by setting the forgetting factor $\alpha$ to one, yielding the following transfer function:

$$H(z) = \frac{1}{2} \cdot \frac{1+z^{-1}}{1-z^{-1}} \cdot \left[ \frac{K_i}{2} \cdot \frac{1+z^{-1}}{1-z^{-1}} + (1-K_i) \right].$$

This approach may be appropriate in an embodiment in which a different type of filtering, such as the earliest-arrival packet filtering described elsewhere herein, provides sufficient noise reduction.

The adaptive-bandwidth filter could use adaptive gain in addition to or in place of adapting one or more poles. In such an arrangement, the filter starts with a higher gain when the loop begins its convergence process and then the gain is subsequently reduced as the loop converges to a steady state. The gain adaptation may proceed as follows:

1. Start with a value of G given by a first multiplication factor $m_1$ times a nominal value of G. The loop starts converging and the frequency error moves from some finite value approaching zero.

2. At one point, the sign of the frequency error will change as the system overshoots. When that happens, the gain G is reduced to a value given by a second multiplication factor $m_2$ times the nominal value, where $m_2 < m_1$.

3. When the filtered phase error drops below a certain threshold, the gain G is reduced to its nominal value.

In one possible implementation of this gain adaptation technique, the first and second multiplication factors $m_1$ and $m_2$ are selected as four and two, respectively, although other multiplication values may be used as long as the system remains stable for each of the different gain values used in a given implementation.

The form of the PI controller can also be varied in other embodiments. For example, the form of the PI controller used in (10) may be modified as follows:

$$\frac{K_i}{2} \cdot \frac{1+z^{-1}}{1-z^{-1}} + (1-K_i) \Longrightarrow \frac{K_i}{2} \cdot \frac{1+z^{-1}}{1-z^{-1}} + 1$$

Numerous other alternative PI controller implementations are possible, as will be appreciated by those skilled in the art.

Figure 5:
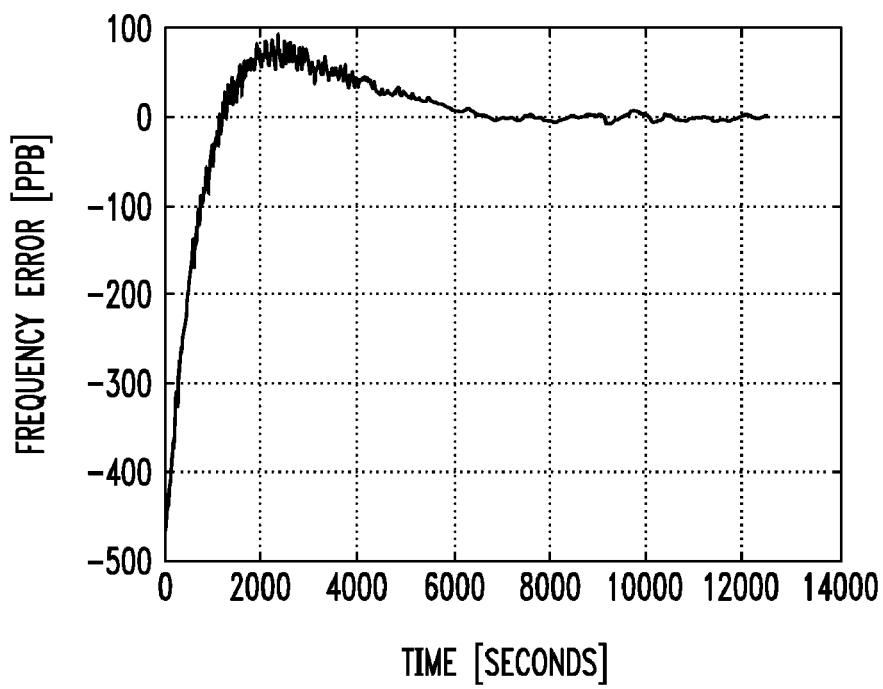
FIG. 5 is a plot of an exemplary step response of the clock recovery loop of FIG. 4A.

FIG. 5 shows a simulated step response of the model 400B of the clock recovery loop 400A having a loop filter 412 as defined in equation (10). The network delay is modeled as a sequence of independent, identically-distributed (i.i.d.) Gaussian random variables with 10 ms mean and 100 μs standard deviation. The loop parameters are set to $K_o \cdot G = 10^{-4}$, $K_i = 3 \cdot 10^{-5}$, $\alpha^{max} = 10^{-2}$, $\alpha^{min} = 10^{-4}$, $\phi_e^{max} = 4 \cdot 10^{-3}$, $\phi_e^{min} = 4 \cdot 10^{-5}$. An oscillator with initial offset of 450 PPB and a linear drift of 10 PPB per day was modeled. It should be noted that these particular loop parameter values are just one example of a set of parameters that may be used in implementing the clock recovery loop 400A.

Initially, the bandwidth of the loop is wide and the PDV produces noise of relatively high frequency and high amplitude. As the system converges past the overshoot peak, the loop bandwidth is narrowed and the noise reduces in frequency and amplitude, producing a stable recovered clock with very slow wander and completely eliminating the drift.

Discontinuity Detection

Analysis thus far has assumed that the PDV noise is a stationary process. This is indeed the case under continuous steady network load and static routes. If that assumption is not satisfied, the noise is not stationary, which impacts the recovered clock performance.

Figure 6:
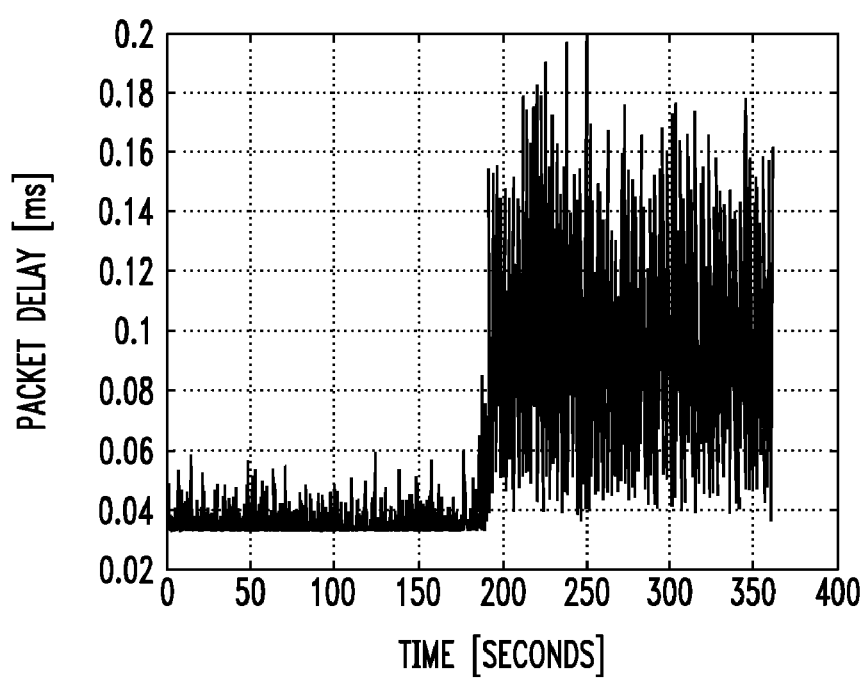
FIG. 6 is a plot showing packet delay as a function of time and illustrating the impact on packet delay of a step increase in network congestion.

Discontinuities in the PDV as a function of time may arise due to, for example, sudden congestion changes and route changes. FIG. 6 shows an end-to-end delay trace for a 10-hop network with timing traffic transmitted on a strict priority queuing class and background traffic (best-effort queuing class) load switched from 20% to 80%. This is defined as a standard test case in the above-noted ITU-T G.8261 recommendation. More specifically, the recommendation calls for changing the background load between 20% and 80% every hour and running the test for 24 hours.

Typical discontinuities change both the mean and variance of the packet delay. Since the mean delay is a step function, the frequency error estimator will produce a delta pulse input to the loop. As mentioned previously, the noise of the estimator is proportional to the discrete differential of the end-to-end packet delay, which is also known as packet jitter. Hence, without intervention, the recovered clock will have the impulse response of the loop superimposed on it. Due to the low bandwidth of the loop filter the disturbance will take a very long time to settle and the recovered clock performance will be severely impacted. Even a small disturbance to the recovered clock is sufficient to fail the long-term wander conformance test. A separate mechanism is therefore used to recognize and mitigate the effect of congestion steps and route changes.

Between discontinuities, PDV is a stationary process and the loop produces a stable output. Assuming that the system is in a converged state, the output frequency error has zero mean and varies in accordance with the residual noise. Stopping the oscillator updates for short time (i.e., leaving the oscillator free-running using the last known good correction) does not severely affect the clock output. This is because the oscillator must be selected such that it can sustain short periods of free running, known as the "holdover." The discontinuity handling mechanism of the present embodiment generally operates as follows: when the discontinuity is detected the loop is put in a temporary holdover mode and the oscillator is not updated. After the input becomes stable again, the loop is closed.

A first discontinuity estimator may be defined as $$j_1[i] = \frac{(\delta_s[i] - \delta_m[i])^2}{var_{k=1}^{N_v}(|\delta_s[i-k] - \delta_m[i-k]|)}, \quad (12)$$

where the $var_{k=1}^{N_v}(.)$ operator is the variance calculated over $N_v$ consecutive samples of its argument. Intuitively, any sudden change in packet arrival delay would cause the value in the numerator to be significantly greater than its variance, producing a spike in $j_1[i]$. Thus, a discontinuity can be detected by comparing the signal with a pre-defined threshold. This detector is very fast in that it can detect the presence of a discontinuity instantaneously. However, it does not produce a detectable spike when the background traffic transitions from high load to low load state.

Hence, we may define a second discontinuity estimator as $$j_2[i] = \frac{(slope_{k=0}^{M-1}(T_2[i-k]) - \delta_m[i])^2}{var_{k=1}^{N_v}(|\delta_s[i-k] - \delta_m[i-k]|)}, \quad (13)$$

which produces a detectable spike in $j_2[i]$ for both general types of discontinuities, but is slower; the spike rises slowly over several samples, so the discontinuity is detected only after the "damage" to the loop input signal has already been done. It also has higher probability of false positive detection because the spikes are smaller relative to the noise floor.

Once the discontinuity has been detected, a corrective action can be taken to prevent the loop from responding with an impulse response. Intuitively, this can be achieved by temporarily stopping the oscillator updates until the disturbance settles. However, this is not sufficient in cases when the discontinuity is detected after the impulse has already been seen by the loop; a mechanism to "undo" the damage is necessary. We solve this by keeping track of the loop state for a particular number of most recent samples (e.g., the 128 most recent samples), where the loop state includes all variables that have memory (i.e., variables whose new value depends on their previous value). When a discontinuity is detected, we first rewind the state of the loop to the one 128 samples before the jump (an empirically chosen number that is significantly greater than the typical delay of the secondary discontinuity estimator). Values other than 128 samples may be used for rewinding the state of the loop in other embodiments. Generally the previous state to which the loop is rewound corresponds to a state existing in the loop a designated number of samples prior to detection of the discontinuity.

If the system was converged before the discontinuity, the above-described rewinding approach will restore it to the previous state within the bounds of the residual noise. This state must be held until the discontinuity exits the window of samples used to calculate the slope in (7). The rationale is that for as long as the slope calculation encompasses the discontinuity, the frequency error will be incorrect and the system will perform better if kept in the holdover mode. We do this by forcing the phase error to zero, which for a type-2 system maintains the last known output.

Following the holdover, it is necessary to reintroduce the actual frequency error and resume the tracking of the master clock. However, if that is done abruptly, the loop will still respond with the impulse response, one of much smaller magnitude than if the discontinuity is left unhandled, but still sufficient to impact the performance. Hence, we modulate the frequency error with a linear function that ramps from 0 to 1 in time that is 10 times longer than the window used to calculate the slope in (7). We call this the recovery period. During this period, we restart the variance calculation in the denominator of (12) and (13) and also disable the discontinuity detectors.

The configuration of the exemplary discontinuity handling algorithm described above is based on two assumptions. The first is that the system is in converged state. Recall that we impose the holdover assuming that forcing the phase error to zero will keep the system in the correct state. This is true only if the actual phase error in the noise-free environment is zero, which is not true during the convergence process. Hence, a question of interest is whether a discontinuity during the convergence process has any adverse effect on the system. We conducted extensive experiments in which we have introduced discontinuities during the convergence process and found that the net effect is only in slowing down the convergence process, but not stopping it.

The second assumption we made is that the new discontinuity does not occur while re-introducing the phase error into the loop. This assumption sets the limit on what network behavior the clock recovery algorithm can tolerate. The above-noted ITU-T G.8261 recommendation requires that the clock recovery algorithm be able to handle a discontinuity that occurs once every hour. In an implementation of the FIG. 4A clock recovery loop with a recovery period of 1280 samples (10 times the slope fitting window length of 128 samples) and SYNC message arrival rate of 16 packets per second, it will take approximately 15 minutes to handle the discontinuity and return the system to a state where it is capable of handling the next one, which is well within the requirements of the recommendation.

Secondary Frequency Error Estimator

Figure 7A:
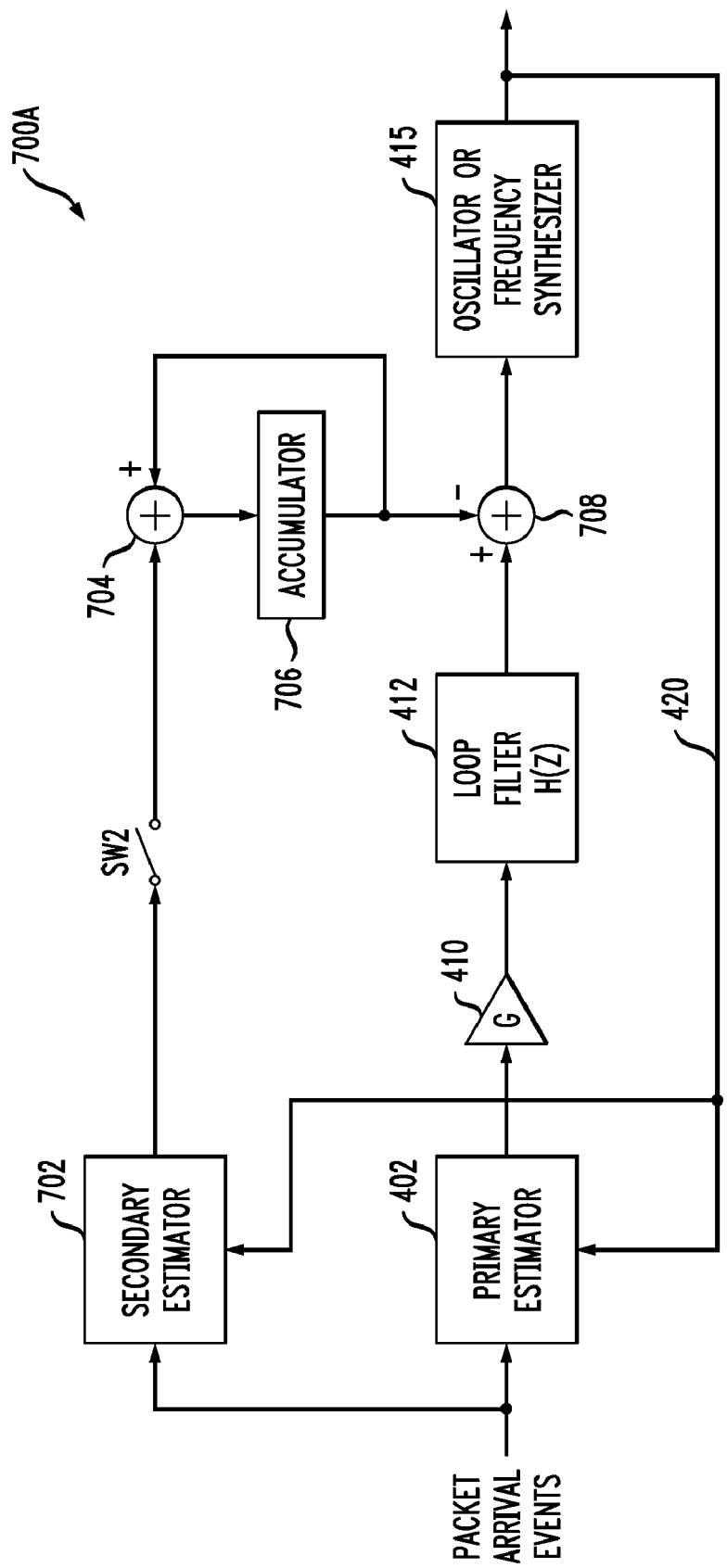
FIG. 7A is a block diagram of a second illustrative embodiment of a clock recovery loop implemented in a given one of the communication devices of FIG. 2.

FIG. 7A shows an alternative embodiment of a clock recovery loop 700A which includes a secondary frequency error estimator 702, also referred to herein as simply a secondary estimator. The secondary estimator 702 runs in parallel with a primary loop comprising elements 402, 410, 412, 415 and 420 of FIG. 4A. The secondary estimator 702 is coupled to the oscillator 415 switch SW2, signal combiner 704, accumulator 706, and signal combiner 708. Like the primary frequency error estimator 402, the secondary estimator 702 receives as its inputs packet arrival events and feedback via feedback path 420 from the output of the primary loop. Each time switch SW2 closes, the output of the secondary estimator is added to a running sum maintained by the accumulator 706. The output of the accumulator is subtracted from the output of the loop filter 412 in signal combiner 708. This arrangement achieves periodic corrections of the oscillator output.

Figure 7B:
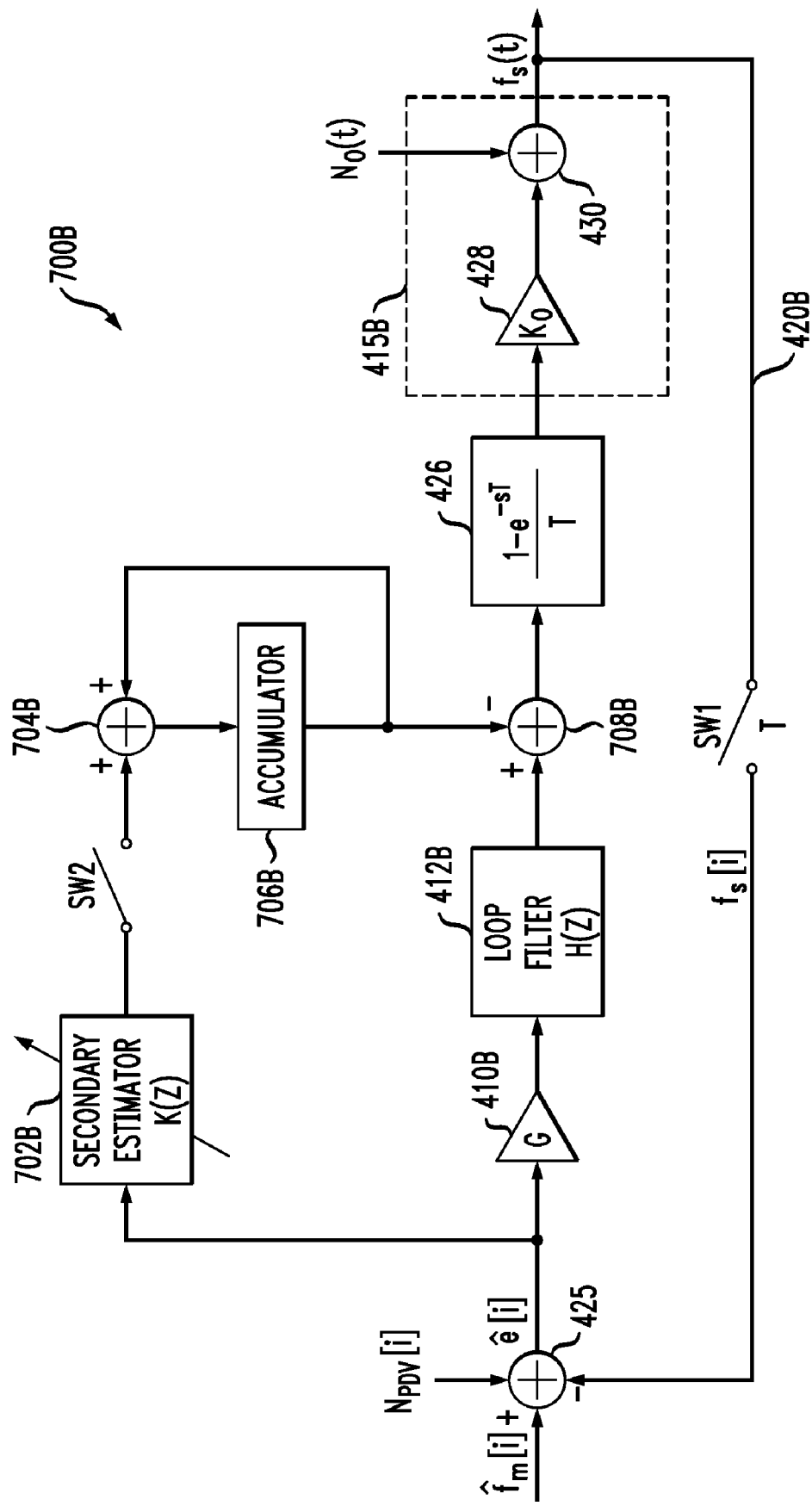
FIG. 7B is a mathematical model of the clock recovery loop of FIG. 7A.

FIG. 7B shows a corresponding mathematical model 700B of the clock recovery loop 700A of FIG. 7A. Again, elements present in the clock recovery loop 700A that are also present in the mathematical model are denoted in FIG. 7B using similar reference numerals. These elements in FIG. 7B include primary estimator 402B, gain stage 410B, loop filter 412B, oscillator or frequency synthesizer 415B, feedback path 420B, secondary estimator 702B, signal combiner 704B, accumulator 706B, and signal combiner 708B. The mathematical model also shows additional elements 425, 426, 428 and 430 as previously described. As indicated previously, such additional elements need not be present in a given physical implementation of the clock recovery loop, but are part of the loop model.

The secondary estimator 702B is modeled in this example as a possibly time-variant transfer function K(z) adapted to receive as its input the frequency error estimate ê[i] from the signal combiner 425. This modeling arrangement is used for simplicity and clarity of subsequent description of the operation of the loop. In the embodiment of FIG. 7A, the secondary estimator 702 operates on the packet arrival events and uses the output frequency of the loop as its reference.

The FIG. 7A embodiment provides improved convergence relative to the FIG. 4A embodiment, as will now be described in greater detail. Conceptually, the clock recovery loop 400A of FIG. 4A may be viewed as a feedback control system with a very large time constant (i.e., a narrow loop bandwidth). Narrow loop bandwidth facilitates the suppression of PDV noise, but at the expense of (1) reduced ability to track the local oscillator wander, and (2) slow convergence. The first problem can be mitigated by using a more stable local oscillator. The second problem becomes apparent during the slave device startup (e.g., achieving initial acquisition) and if for some reason the master device frequency abruptly changes (e.g., re-acquisition after the master reference step). Without any augmentation, a feedback control system with large time constant can take a long time to acquire the lock.

Before proceeding, we define some additional terminology. The process of acquiring the lock, that is, the process of converging the slave clock output frequency from one with finite frequency error to one with zero long-term average frequency error, is called acquisition. The process of maintaining the zero long-term average frequency error (i.e., bounded phase error) is called tracking. When the clock recovery loop is performing the acquisition process, we say that it is in the acquisition mode. Likewise, when the lock has been acquired and the loop is only doing small corrections to offset the local oscillator wander, we say that the loop is in the tracking mode.

As mentioned above, the secondary estimator 702 runs in parallel with a primary loop configured substantially as shown in FIG. 4A. In the acquisition mode, the output of the secondary estimator is injected into the primary loop at sparse time intervals. In other words, most of the time the switch SW2 is open and the secondary estimator runs without any impact to the normal operation of the primary loop. However at periodic time intervals (typically every few minutes but in general determined by the time it takes the secondary estimator to converge and the level of noise in the system), the switch SW2 closes and the accumulator 706 updates. In tracking mode, the secondary estimator is not used, that is, the switch SW2 is always open.

Suppose that initially the frequency error is high, the clock recovery loop 700A is in acquisition mode and its primary loop is slowly pulling the oscillator 415 towards the correct value. Because the primary loop has a high time constant, this process happens very slowly. At the same time, the secondary estimator 702 is a system (possibly a time-variant system or adaptive system) that has its own time constant that is significantly smaller than the one of the primary loop and thus produces the frequency error estimate well before the primary loop converges. The secondary frequency error estimate may be noisy, but as long as its confidence interval is significantly smaller than its mean, adding this estimate to the output bias of the primary loop will result in a frequency step in the correct direction. So the switch SW2 is closed and the value produced by the secondary estimator 702 is added to the accumulator and the primary loop output abruptly steps towards the smaller error. Notice that the accumulator output is a bias that is added to the primary loop output.

The process then repeats, the primary loop continues to converge (with its own, slow, time constant), while the secondary estimator 702 is reset and the estimation process is restarted. Next time the secondary estimator converges the step will be smaller, but as long as it is greater than the confidence interval, it makes sense to add it to the bias. Once the error estimation becomes so small that is comparable with its confidence interval, the benefit of adding it to the bias diminishes because the secondary estimator output starts to act as a noise. At that point the secondary estimate is not used any more and the primary loop is allowed to pull in as any stable linear system would do; the clock recovery loop 700A then enters the tracking mode.

Figure 8B:
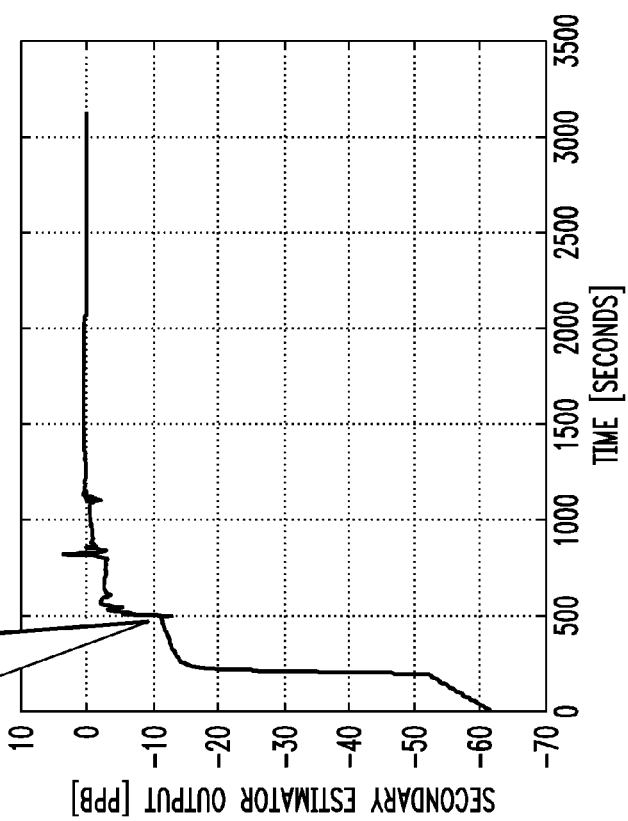
FIGS. 8A and 8B are plots illustrating aspects of the operation of the clock recovery loop of FIG. 7A.
Figure 8A:
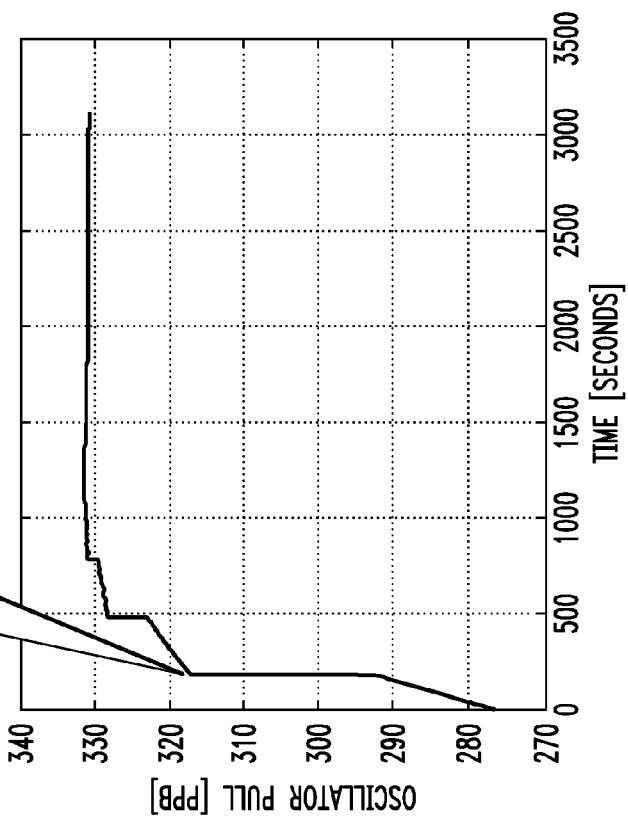

FIGS. 8A and 8B show the respective outputs of the loop filter 412 and the secondary estimator 702 during the convergence process. Step changes of the output frequency are the points where the secondary estimator output is added to the bias; we call these points in time "injection points." Prior to the injection point, the secondary estimator output is stable (i.e., converged). Immediately after the injection point the secondary estimator output is unsettled as it is searching for the new estimate.

In general, the secondary estimator 702 can be any kind of processing element (linear or non-linear, time-invariant or time-variant) that has a time constant significantly lower than that of the primary loop and results in a good estimate for given noise statistics. For example, the secondary estimator may be implemented as a Kalman filter K(z) (a type of linear time-variant system), which estimates the state variables of the system given potentially noisy observation of a signal related to the state. The system assumed is a second-order system of two state variables: time (t) and the clock period (T). The goal is to produce the estimate of the latter. The observed system outputs are the timestamps that represent the packet transmission and reception times with reference to the master and slave clock, respectively.

For the system as formulated in the previous paragraph, the Kalman estimator works as follows. Initially, the time estimate $\hat{t}$ is set to the receiving timestamp $T_2$ of the first packet and the clock period estimate $\hat{T}$ is set to the nominal period of the master clock. Kalman covariances are initialized as follows:

$P_{11}$=square of the ratio between typical packet delay variation and the average SYNC message inter-departure time $P_{22}$=square of the 2× maximum normalized frequency deviation $P_{12}=P_{21}=0$ According to Kalman filter theory, the covariances $P_{11}$ and $P_{22}$ should be set to the squares of the time and clock period relative uncertainties, respectively. For example, if the typical PDV is no higher than 1 ms and we just copy the timestamp value for an initial time estimate then our uncertainty is 1 ms or speaking in relative terms it is 1e-3 divided by the packet inter-departure time. Likewise, if the clock oscillator conforms to Stratum-3 specifications then its lifetime deviation is no higher than 4.6 PPM, and if we initially estimate the frequency at the nominal one, the highest error we can theoretically make is 2×4.6 PPM=9.2 PPM, so that is our uncertainty. Over time, these covariances will become smaller as the estimator is exposed to more packets (i.e., as it converges).

For each SYNC message arrival the following operations are executed to update the master period estimate. First, the predicted value of the timestamp $\bar{t}$ is calculated as the sum of the master clock period estimate and the time estimate:

$$\bar{t} = \hat{t} + \hat{T} \quad (14)$$

Note that $\hat{t}$ and $\hat{T}$ are the estimates available from the previous iteration. Then based on the observed SYNC message arrival timestamp $T_2$ the prediction error $\alpha_p$ is calculated:

$$\alpha_p = T_2 - \bar{t} \quad (15)$$

Next the current values of the Kalman covariances and gains are used to produce the new estimate of time and master clock period (i.e., $\hat{t}$ and $\hat{T}$):

$$\bar{P}_{11} = P_{11} + 2P_{12} + P_{22} \quad (16)$$
$$\bar{P}_{12} = P_{12} + P_{22}$$
$$\bar{P}_{22} = P_{22} + \sigma_T^2$$
$$\tilde{P}_{11} = \frac{\bar{P}_{11}}{\bar{P}_{11} + \sigma_\tau^2}$$
$$\tilde{P}_{12} = \frac{\bar{P}_{12}}{\bar{P}_{11} + \sigma_\tau^2}$$
$$\tilde{P}_{22} = \frac{\bar{P}_{22}}{\bar{P}_{11} + \sigma_\tau^2}$$
$$\hat{t} = \bar{t} + \alpha_p \cdot \tilde{P}_{11}$$
$$\hat{T} = \hat{T} + \alpha_p \cdot \tilde{P}_{12}$$

where $\sigma_T^2$ is the master clock period variation, which can be assumed to be zero in practice (i.e., the assumption is that the master clock is stable and thus its frequency does not vary over time) while $\sigma_\tau^2$ is the relative PDV which is set to the upper bound for the given network (e.g., suppose the PDV is at most 1 ms, so we divide that by the nominal packet inter-departure time and square the result to get $\sigma_\tau^2$). Notice the recursive nature of the above procedure: it starts with the current estimates $\hat{t}$ and $\hat{T}$ and produces their new values for the next iteration.

Finally, the iteration completes by updating the Kalman covariances $P_{11}$, $P_{22}$ and $P_{12}$ to be used in the next iteration:

$$P_{11} = \sigma_\tau^2 \cdot \tilde{P}_{11} \quad (17)$$
$$P_{12} = \sigma_\tau^2 \cdot \tilde{P}_{12}$$
$$P_{22} = \sigma_\tau^2 \cdot \tilde{P}_{22} + \sigma_T^2 \cdot \tilde{P}_{11} + \frac{\bar{P}_{11} \cdot \bar{P}_{22} - \bar{P}_{12}^2}{\bar{P}_{11} + \sigma_\tau^2}$$

The process repeats recursively and the master clock period estimate $\hat{T}$ converges towards the actual value. An important detail to notice is that the estimate $\hat{T}$ is calculated based on the timestamp observations $T_2$ that are generated with the reference to the local clock at the slave device which is potentially an inaccurate clock. The master device clock on the other hand is considered accurate. So when the slave estimates the value $\hat{T}$ the fact that the value is different from the nominal value is actually due to the offset at the slave side, not the master.

Once the Kalman estimator converges, the correction that should be applied to the output is calculated as $(1-\hat{T}/T_{nominal})$. The switch SW2 of FIG. 7A is closed, and the new correction is added to the accumulator 706.

The Kalman covariances and gains are then reset to their initial values, and the new estimation cycle begins. When the secondary estimator converges again, the new injection is performed. Each time the magnitude of the error estimate is smaller (because the primary loop approaches the steady state). At one point the noise of the secondary estimator will become comparable with the actual estimation and the injections should no longer be performed. The criterion that determines when the injections should stop can be as simple as setting some fixed time following the system startup to more complex ones like looking at the phase error of the primary loop and comparing it with some threshold (i.e., phase error below the threshold indicates a tracking mode when the injections should not be performed). Likewise, a phase error threshold can be used to determine if system has for some reason lost the lock such that the injections should be restarted.

Maintain-Phase Technique for Handling PDV Discontinuities

A number of exemplary techniques for handling PDV discontinuities (also referred to as "jumps") were described above. To summarize, discontinuities occur when there is a sudden load change in the network (e.g., sudden congestion) or if the network route changes (i.e., packets start taking a different path in the network). Two types of jumps were described: in the first the mean and the spread changes, but the "floor" of the PDV distribution remains "anchored." In the other one, the floor also moves. The term "floor" here is defined as the minimum packet delay observed during the stationary period of the PDV, that is, during the period that does not include any discontinuity. The techniques for handling the jumps described above assume that the oscillator drive value that was used a certain number of samples before the jump is the best one to rewind to and hold during the discontinuity. We will refer to a given such technique as a maintain-frequency technique.

In this section, we describe an alternative approach referred to as the maintain-phase technique. The maintain-phase technique in certain situations provides improved performance relative to the maintain-frequency technique. We also describe a possible criterion that can be used to decide which of these two techniques to use. Notice that the maintain-frequency technique strives to maintain constant frequency during the transition, hence the name. One possible drawback of that technique is that in situations involving high levels of noise, the instantaneous frequency may have an error of a few PPB and the maintain-frequency technique rewinds the system to a single point in the near past. So if it is "unlucky" enough to rewind it to, for example, a point that had an instantaneous error of say 2 PPB, holding this value for say 100 seconds will result in 200 nanoseconds (ns) of accumulated phase error. In addition, when the jump in PDV occurs, it typically takes a finite time to detect it and during that detection time additional phase error can build up (typically another few hundred ns). For a Maximum Time Interval Error (MTIE) budget of a few microseconds (typical for most ITU specifications, including, for example, ITU-T G.823, ITU-T G.824 and ITU-T G.8261), this can be significant in the sense that only a few jumps that result in a phase error buildup in the same direction may be sufficient to deplete the entire MTIE budget.

The maintain-phase technique attempts to undo the phase error buildup and maintain the zero phase error during the jump.

Figure 9:
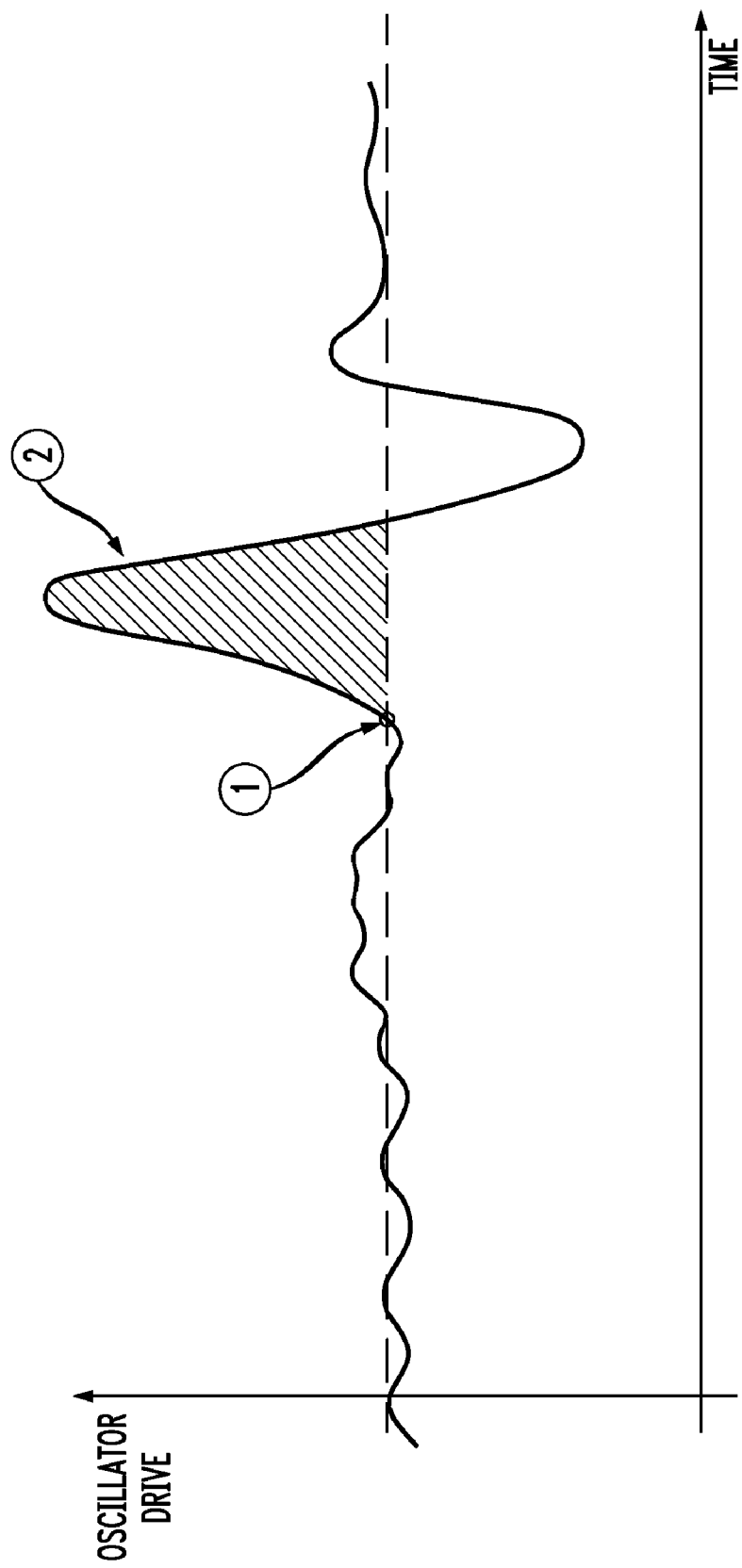
FIG. 9 is a plot of oscillator drive as a function of time for an unhandled discontinuity in packet delay variation (PDV).

FIG. 9 shows typical oscillator drive for an unhandled jump. The jump has occurred at point 1 and the oscillations that follow are the consequence of the jump. Before the jump, the oscillator drive was tracking the temperature wander and systematic drift of the oscillator, exhibiting small variations over time. Additional variations were due to residual PDV noise. After the jump, the drive is dominated by the loop impulse response trajectory and does not track the oscillator (it will continue to track the oscillator wander after the impulse response settles). The dashed line shows the mean drive before the jump that roughly corresponds to the zero frequency error (i.e., constant phase error); the assumption is that the system was in the steady state before the jump. The shaded area after the jump, indicated generally by point 2, is proportional to the phase buildup that will occur after the jump. After the first lobe the loop will build up positive phase error (the sign depends on the direction of the jump). The second lobe will compensate for some of the phase error buildup but because the area under it is smaller than that of the first lobe, the residual phase error will be non-zero. When the impulse response settles, the result will be a finite phase error buildup.

To compensate for this buildup, the maintain-phase jump handling technique constructs the approximation of the zero-error oscillator drive by running the oscillator drive signal through a low-pass filter. This signal is essentially an approximation of the dashed line shown in FIG. 9. The signal is not part of the closed loop system (the oscillator is still driven as described previously herein); it is only used to calculate the phase buildup at the point of jump detection. The choice of the filter bandwidth is a tradeoff: narrow bandwidth eliminates more PDV noise, but requires longer periods of steady state between the jumps (i.e., limits the system ability to handle frequent changes in network load and reroutes).

An example of a low-pass filter that may be used to estimate the zero-error oscillator drive is a filter having a discrete-time domain implementation given by:

$$y[n]=(1-\alpha)y[n-1]+\alpha x[n]$$

where x[n] is the filter input, y[n] is the filter output and α is the forgetting factor of the filter. This is a type of first-order infinite impulse response (IIR) filter, but other filters may be used, including higher-order filters and FIR filters.

When the jump occurs, the system starts to respond with the impulse response, but after some finite time the jump condition is detected. The next step is to drive the oscillator for some short period with the value that will undo any phase buildup that accumulated between the jump occurrence and the jump detection.

Figure 10:
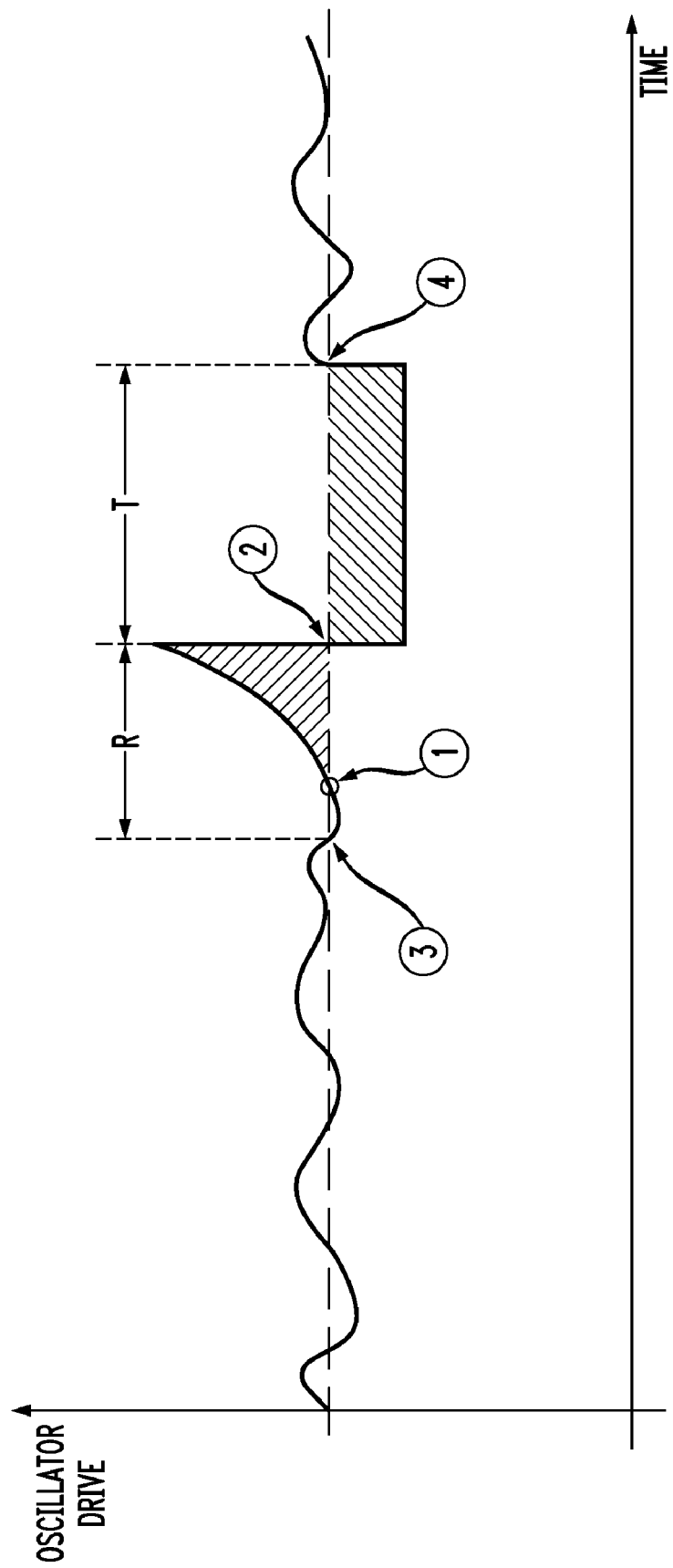
FIG. 10 is a plot of oscillator drive as a function of time for a PDV discontinuity that is handled using a maintain-phase technique.

FIG. 10 shows the jump that occurred at point 1 and was detected at point 2; point 3 is the point for which the system assumes is the occurrence of the jump. Note that the assumed jump occurrence point (point 3) is not the same as the actual jump occurrence point (point 1) because the system only knows the point of jump detection (point 2). Hence it must assume some worst-case detection delay and use the point 3 in the past as the reference point. To compensate for the phase buildup, the system drives the oscillator with a constant signal such that the shaded area under the dashed line after the jump detection point (point 2) equals the shaded area above the dashed line before the jump point (point 1).

The main source of error is the fact that the system does not know the value of the zero-error drive; it can only estimate it, which is what the low-pass filtered version of the oscillator drive is used for. The second source of error is the fact that the system assumes that the value of the zero-error drive at the assumed jump occurrence point (point 3) is the same zero-error drive at the jump detection point (point 2). This is not necessarily the case because the oscillator may have exhibited some short-term wander between the two points. The closer the two points are together, the lower the impact of the oscillator wander is, but if they are too close the accuracy of the zero-error estimate can be lost because the effects of the loop impulse response will be reflected in the low-pass filtered version of the oscillator drive signal. Finally, the third source of error is the assumption that during the hold time (time between point 2 and point 4 in FIG. 10 when the oscillator is driven by a constant phase-compensating signal) the oscillator does not wander away. Since the wander always exists, it introduces a finite error. The shorter the hold time, the lower the error. However, if the hold time is too short, the amplitude of the phase-compensating signal may be too high, resulting in large instantaneous frequency error.

A hold time that is too short can also have another harmful effect because the congestion step in the network is usually followed by a non-negligible transition time for PDV to become a stationary random process (during the steady state, PDV is a stationary process, but during the transitions it is not). If the feedback control is introduced too soon, the system may see additional "after-shocks" due to settling PDV. So it is better to extend the hold time until the conditions in the network fully stabilize. The exact time depends on the network size, topology and the nature of the background traffic, but can be determined empirically for typical network deployments. If on the other hand, the hold time is made too long, the local oscillator wander will become the dominant source of the phase error (notice that during the hold time the feedback control loop is inoperative so the oscillator is essentially in the free running mode).

The drive value to use during the hold time can be calculated as follows:

$$X[k] = \frac{1}{T}\left((R+T)\cdot X_0 - \sum_{i=0}^{R-1} X[n-i]\right), n+1 \leq k \leq n+T \quad (18)$$

In this equation, the jump detection point is at sample n (point 2 in FIG. 10), R denotes a number of samples between sample n and a prior sample associated with stationary PDV, and T denotes a number of samples between sample n and a subsequent sample associated with stationary PDV. The point to which the system "rewinds" after the jump detection (point 3 in FIG. 10) is sample n-R and the hold time (time between points 2 and 4 in FIG. 10) is between sample n+1 and n+T. X[.] is the amplitude of the oscillator drive signal represented as a discrete-time function of sampling points and $X_0$ is the value of the zero-error drive estimate taken at the sampling point n-R.

It should be noted that R and T in equation (18) are numbers of samples arriving at the rate at which the loop operates. Each sample generally corresponds to a particular packet arrival event, and these events are identified by index k in equation (18). In an embodiment which utilizes earliest-arrival packet filtering, as will be described in greater detail elsewhere herein, these events are grouped in windows and an earliest-arrival packet filtering operation is run, producing one output per window, so the resulting sampling rate of the loop is the packet rate divided by the window size. For example, if the packets are arriving at the rate of 64 packets/second and the window size is 512 packets, then the loop sampling time is 8 seconds or its sampling rate is ⅛ Hz.

Equation (18) above assumes that the clock recovery loop is implemented as a discrete system, which is likely given that clock recovery algorithms of the type described herein may be efficiently implemented primarily in software; a similar formula using the integral sign instead of the sum can be derived for the continuous-time system.

After the hold time has passed, the feedback control is reestablished. The phase error and the frequency error are by construction assumed to be zero. From there, the system builds up the new state and continues to act as a linear system.

The maintain-phase jump compensation technique works very well when the system is in tracking mode. However in the acquisition mode, low-pass filtering the oscillator drive signal does not yield a reliable zero-error drive estimate. If the jump occurs in the acquisition mode, it is better to use the maintain-frequency technique. In fact, the maintain-phase technique in the acquisition mode will often result in a disturbance that is higher than if the jump is left unhandled. So the system should typically be augmented with a module that determines whether the system is in the acquisition mode or the tracking mode and uses one or the other technique to compensate for the effects of jumps. One possible indicator of the tracking mode is the absolute value of the phase error run through a low-pass filter or averaged over some finite time interval. If such a signal is zero or close to zero (typically determined by some pre-defined threshold) the system is assumed to be in the tracking mode. Otherwise it is in the acquisition mode.

Earliest-Arrival Packet Filtering and Related Discontinuity Detection

The clock recovery loop 400A described in conjunction with FIG. 4A runs on every incoming packet. As such, the clock indications are extracted from the mean inter-arrival times of the SYNC messages. Such a system uses very low bandwidth filters in the loop to remove the PDV noise. The rationale is that the PDV noise is typically white, while the useful signal is a DC signal (stable clock). If the loop 400A as described previously needs to remove more PDV noise (e.g., in the case of a longer or more congested network) it can do it by tightening the bandwidth, which is achieved by making the value of a smaller or using the longer sample history for input to the linear regression filter. There are two drawbacks associated with this technique. First, narrower loop bandwidth reduces the stability margin of the loop, risking that the system becomes unstable and thus not implementable. Second, a loop bandwidth that is too narrow (even if the system is stable) reduces the ability to track the local oscillator wander and drift. Once the loop becomes too inert the local wander dominates the output disturbance and the system underperforms regardless of how well it filters the PDV noise.

One way to improve the noise immunity is to group incoming packets into blocks and select only the one that had the shortest network transit time. We refer to that packet as the earliest-arrival packet. The loop no longer performs calculations on each arriving packet, but only on each earliest-arrival packet. The rationale for this type of filtering is that the earliest-arrival packets are those that likely experienced little or no queuing delay so they should carry the timing information with minimum amount of noise superimposed onto it. For example, suppose that the SYNC message rate is 64 packets per second and that the algorithm groups packets into blocks of 512 packets. One out of these 512 packets is selected as the earliest-arrival packet and its timestamps are used as an input to the loop. On the average the loop in this example updates the oscillator once every 8 seconds, but two consecutive updates can be as close as ¹⁄₆₄ second apart or as far apart as 16 seconds (if the packets at the extreme ends of two adjacent windows are selected).

Figure 11:
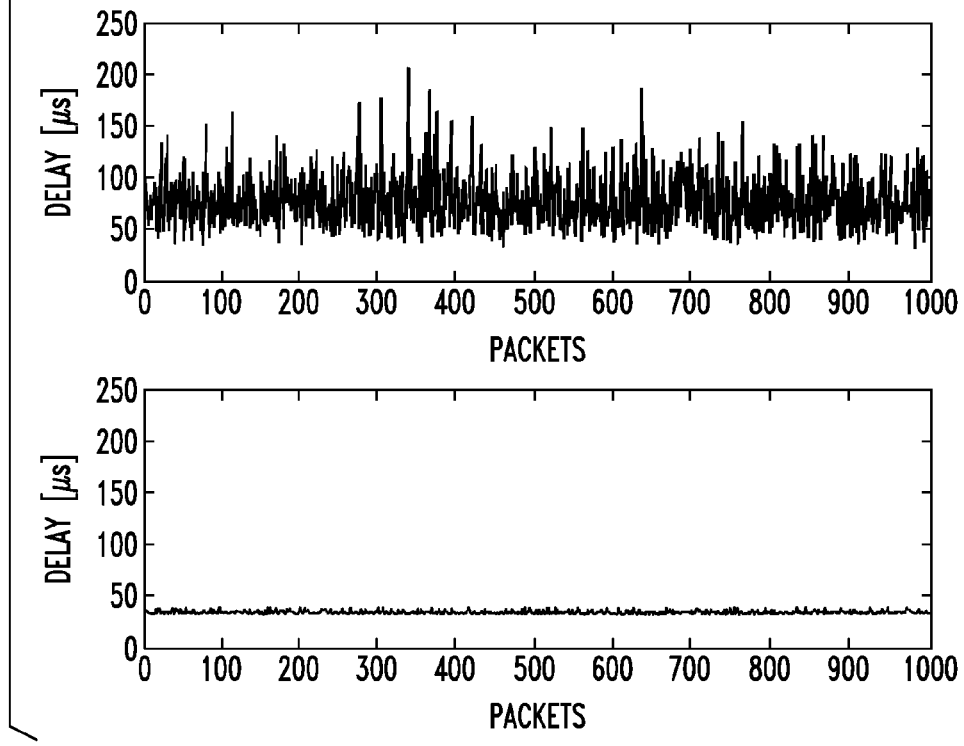
FIG. 11 illustrates reductions in PDV noise resulting from use of earliest-arrival packet filtering.

FIG. 11 illustrates how the earliest-arrival packet filtering reduces the noise level. The top plot of the figure shows the absolute packet delays as a function of packet arrival samples without any filtering. The trace was taken for a 10-hop network on which all switches were loaded with 80% of background traffic. The bottom plot shows the remaining noise after the earliest-arrival packet filtering is applied using a 512-packet window.

The earliest-arrival filtering is a non-linear filtering that removes much of the PDV noise. The downside is that the earliest-arrival filtering is a form of non-uniform downsampling and thus reduces the bandwidth of the loop in a way that is difficult to track mathematically. On the average the loop runs at 1/TW rate where T is the nominal SYNC message inter-departure time (¹⁄₆₄ in the example described here) and W is the length of the earliest-arrival filter window (512 in the example described here). Hence the loop is W times narrower than what it would be if the loop ran on every packet and had the same filter. Therefore if earliest-arrival packet filtering is used, it is necessary to reconfigure the loop filter such that the overall loop bandwidth is still wide enough to track the oscillator wander, but narrow enough to properly filter the PDV noise. In one implementation we use a 32-point linear regression filter and a PI controller (unlike the loop 400A described in conjunction with FIG. 4A, we do not use the additional single-pole adaptive filter). The integration parameter we use is 2e-3 and the filter gain is 600 (which with the oscillator deviation of 10e-6, results in the total loop gain of 6e-3).

The length of the earliest-arrival window W depends on the packet transmission rate and the local oscillator stability. For a given oscillator, higher packet transmission rate allows for the use of longer windows. However, there are limits to what packet rates are practical. Sending many thousands of SYNC messages per second is not likely to be acceptable for the network operator although theoretically and practically possible. Packet rate of 64 or 128 packets per second are still within acceptable limits.

The algorithm can be used with or without the earliest-arrival packet filtering (of course, loop filter adjustments are necessary as described herein). However, notice that the jump detectors as described previously are also based on the assumption that the loop will process every packet, which is no longer true if the loop is augmented with earliest-arrival packet filter. While it is possible to implement separate jump detectors that still examine every packet when determining whether the jump occurred or not, it is also possible to take advantage of earliest-arrival packet filtering to implement different (possibly better) jump detectors. The opposite is also true: jump detectors using the earliest-arrival packet filtering can be used in conjunction with a loop that runs on every packet arrival if it is so desired.

First, we observe two classes of jumps and treat them separately. First are the jumps due to the network load change, which we will refer to as the "congestion jumps." Second are the jumps that occur due to the change or routes in the network, which we will refer to as the "reroute jumps."

Figure 12:
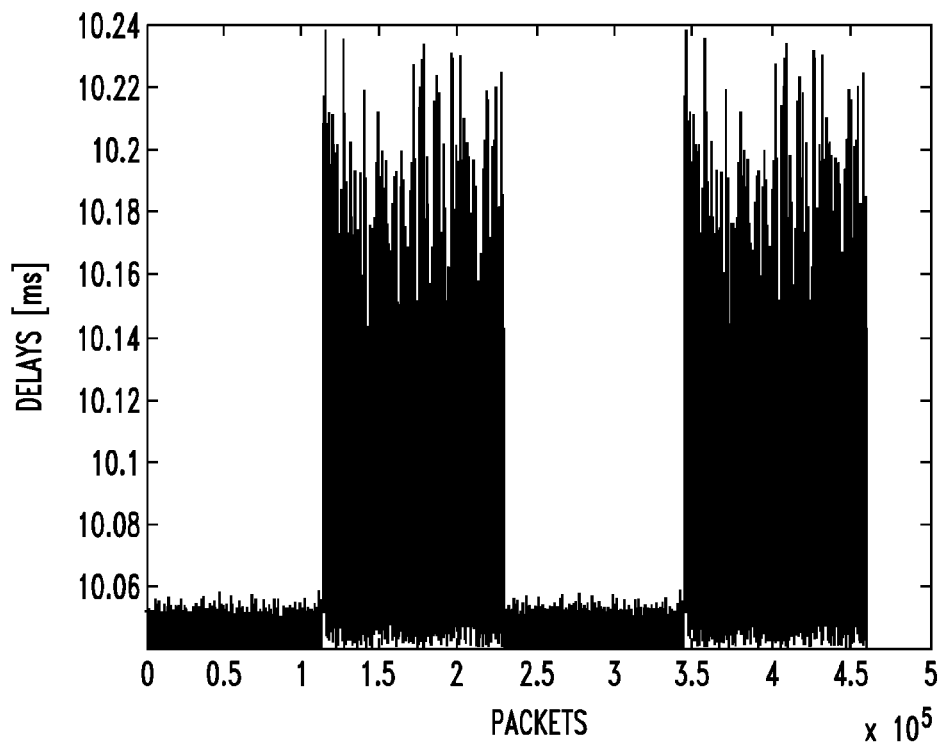
FIG. 12 illustrates congestion discontinuities.

Congestion jumps typically exhibit a change in the mean and the spread of PDV, but the floor of the PDV distribution remains the same or moves only slightly. Such a jump is shown in FIG. 12 and also in FIG. 6.

In such a signal, the information that the jump has occurred is mostly contained in the PDV spread. After applying the earliest-arrival filter to the packets that exhibited delay pattern of FIG. 12 and subtracting timestamp $T_2$ from $T_1$ of the selected packets (recall that $T_1$ is the departure timestamp of the SYNC message, $T_2$ is the arriving timestamp of the same packet), there is a little variation in the signal constructed in such a way. The transition of that signal is difficult to detect (it can very easily be "buried" in the noise) so it is not a good candidate for jump detection. However, if the software already implements the earliest-arrival packet filter, it is trivial to extend it to implement the opposite function, the latest-arrival packet filter. If a signal is constructed by calculating the timestamp difference $(T_2-T_1)$ for the packet selected by the latest arrival filter, it will exhibit extremely large swing whenever the congestion change occurs (whether it is a jump-up or opposite jump-down, both of which are shown in FIG. 12).

Now, define the signal $s_{12}$ (for "spread") as the difference between the output of the latest-arrival filter and the earliest-arrival filter. This signal can optionally be passed through a linear low-pass filter for additional smoothing (i.e., noise removal) to yield $\hat{s}_{12}$. Namely, $$s_{12}[n]=\text{LAPF}\{T_2[k]-T_1[k]\}[n]-\text{EAPF}\{T_2[k]-T_1[k]\}[n]$$

$$\hat{s}_{12}[n]=(1-\alpha_{je})\cdot\hat{s}_{12}[n-1]+\alpha_{je}\cdot s_{12}[n] \quad (19)$$

where LAPF{.} is an operator that denotes latest-arrival packet filtering and EAPF{.} is an operator that denotes earliest-arrival packet filtering and we have assumed that a simple first-order low-pass filter with forgetting factor $\alpha_{je}$ was used to smooth out the noise (the use of other filter types for noise removal is straightforward, but probably does not change the results significantly).

The index notation in equation (19) is informal, but clear. Namely, timestamps $T_1[k]$ and $T_2[k]$ are the discrete-time signals (i.e., sequences) indexed by all arriving packets, while $\hat{s}_{12}[n]$ is a discrete-time signal indexed by the blocks of W packets, where W is size of the earliest-arrival filter window. In other words, assuming that W=512, and 512 packets arrive, then index k progressed from 0 to 511 and EAPF and LAPF each produced one sample that is used to construct the sample of $s_{12}$ for n=0 (and the sample used by LAPF may not be the same sample used by EAPF, but both are from the sequence k=0 . . . 511). Then another 512 packets arrived, index k progressed from 512 to 1023, and EAPF and LAPF produce a sample $s_{12}$ for n=1 and so on. This particular notation is used in describing the present embodiment for simplicity and clarity of description. If strict formalism were followed, one could define a set from which k takes its values and a set from which n takes its values and then define a mapping between the two sets.

In alternative embodiments, the LAPF{.} operator used in the computation of the spread signal $s_{12}[n]$ may be replaced with an alternative type of filter operator, such as a mean{.} or median{.} operator. These latter types of filters are useful in situations in which it is likely that one packet may be experience a much larger amount of delay than the other packets being filtered. The mean{.} filtering is generally not as effective as the median{.} filtering, but it is less memory intensive.

Jump detectors utilizing the above-described estimated spread signal $\hat{s}_{12}[n]$ will now be described. The following signal is constructed to detect the jump-up event:

$$j_{up}[n] = \left(\frac{\hat{s}_{12}[n]}{\hat{s}_{12}[n-d]} - 1\right)^2 \quad (20)$$

where d is the delay of the jump detector. Similarly, the signal to detect the jump-down event is constructed as $$j_{down}[n] = \left(\frac{\hat{s}_{12}[n-d]}{\hat{s}_{12}[n]} - 1\right)^2 \quad (21)$$

The delay d can be used to tune the detector to different network conditions. Namely, for networks that provide lots of buffering the jump in PDV may not be abrupt, but build up over the period of few hundred to a few thousand packets. Under these conditions, a larger value of delay d is necessary to make the jump detection signal stand out compared to the noise. Also, in very noisy networks where the low-pass filtering must be applied, the signal $\hat{s}_{12}$ may have a slow rise/fall time not due to the network, but due to the filter itself, which would also warrant a longer detector delay. While longer delay increases the probability of detecting the jump, the drawback is that the jump is detected later, so compensating for the phase error buildup becomes more difficult.

Figure 13:
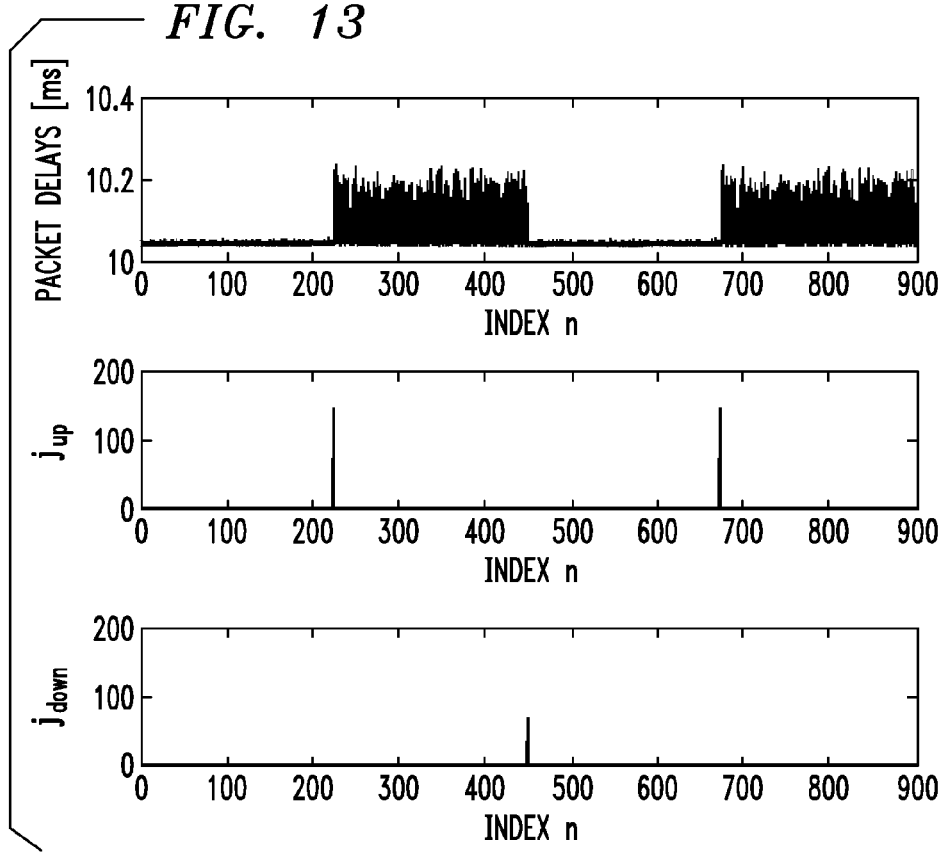
FIG. 13 illustrates discontinuity detector signals corresponding to the congestion discontinuities of FIG. 12.

The three plots in FIG. 13 show $j_{up}$ and $j_{down}$ signals against the PDV of FIG. 12, scaled to the index n. Pulses in the jump detector signals clearly correspond to the locations of the actual jumps and are very well distinguished from the noise (on the scale used to show the jumps, the noise is hardly visible) using a simple comparison with a pre-defined threshold. This plot was constructed directly from the packet delay measurements using parameters d=1 (one sample jump detector delay), W=512 (512-sample earliest-arrival packet filter window) and $\alpha_{je}$=1 (i.e., no low-pass filtering). In practice the signal to process is constructed by subtracting the timestamps which run based on two different clocks ($T_1$ is based on the master clock and $T_2$ is based on the slave clock). Residual noise on the clock output and the finite resolution of the clock makes the actual signal to process a little noisier, but in practical experiments we have observed good robustness of the jump detector with little to no false-positive detections. The trace shown in FIG. 12 is for the 20% to 80% network load step, so the difference in the PDV spread is rather high (which makes the jump very detectable). In practice it is possible to see much smaller differences, which makes the jump detection more difficult. In one implementation, the detector delay may be set to d=8 and the forgetting factor may be set to $\alpha_{je}$=1 (i.e., low-pass filter turned off). Of course, other implementations may utilize other parameter values.

It should be noted that alternative embodiments may use different types of jump detectors. Thus, other types of ratios or functions of the current and delayed estimates $\hat{s}_{12}[n]$ and $\hat{s}_{12}[n-d]$ of the spread signal $s_{12}[n]$ may be used in implementing the detectors. For example, in equations (20) and (21) given above for the respective jump-up and jump-down detectors, the squaring function may be replaced with alternative powers, generally identified by an integer x. Even or odd powers may be used, including a power of one. For odd powers including one, the absolute value of the jump detector signal may be used when comparing the signal to a threshold. Alternatively, if absolute value is not used, such that the jump detector signal is permitted to take on both positive and negative values, two thresholds may be used, one positive and one negative, with each jump detector.

It is also possible in a given embodiment to combine the $j_{up}[n]$ and $j_{down}[n]$ signals into one common signal that is compared against a common threshold.

The second class of jumps, reroute jumps, are characterized by the shift in the PDV floor. They occur when the timing packets change their route through the network and are typically associated with failures of some switches or links in the network. If the new path is of the same number of hops as the old one (but possibly different propagation time due to the length of the wires) and if the same or similar traffic load exists on the new path, the PDV spread will roughly be the same. So the technique used for congestion jumps may not necessarily work. It is important to note that often in the network the new path will have different number of hops or have a different traffic load, so the change in spread will exist (making the congestion jump detector usable), but we have to consider a special case where the spread is the same in both paths and the only difference is in the PDV floor move. Also, sometimes, the floor move may be more visible than the spread move even if both exist.

For these types of jumps, we simply take the square of the first-order derivative of the signal constructed by subtracting the $T_2$ and $T_1$ timestamps of all packets that were selected by the earliest-arrival packet filter and normalize it to its historical variance:

$$j_{reroute}[n] = \frac{\left(\begin{array}{c}EAPF\{T_2[k] - T_1[k]\}[n] - \\ EAPF\{T_2[k] - T_1[k]\}[n-1]\end{array}\right)^2}{\underset{i=1}{\overset{N_v}{\text{var}}}(j_{reroute}[n-i])} \quad (22)$$

In equation (22), the EAPF{.} operator denotes the earliest-arrival packet filter, var(.) is the historical variance operator using the same notation as elsewhere herein and $N_v$ is the number of samples in the past to use when calculating the variance. Similarly to all previously described jump detectors, this one will also result in a signal that produces a pulse whenever the jump it is targeting occurs. The pulse is then compared against the threshold do detect the jump event. In noisy environment, the reroute jump detector can be optionally passed through the low-pass filter before calculating the differential.

Figure 14:
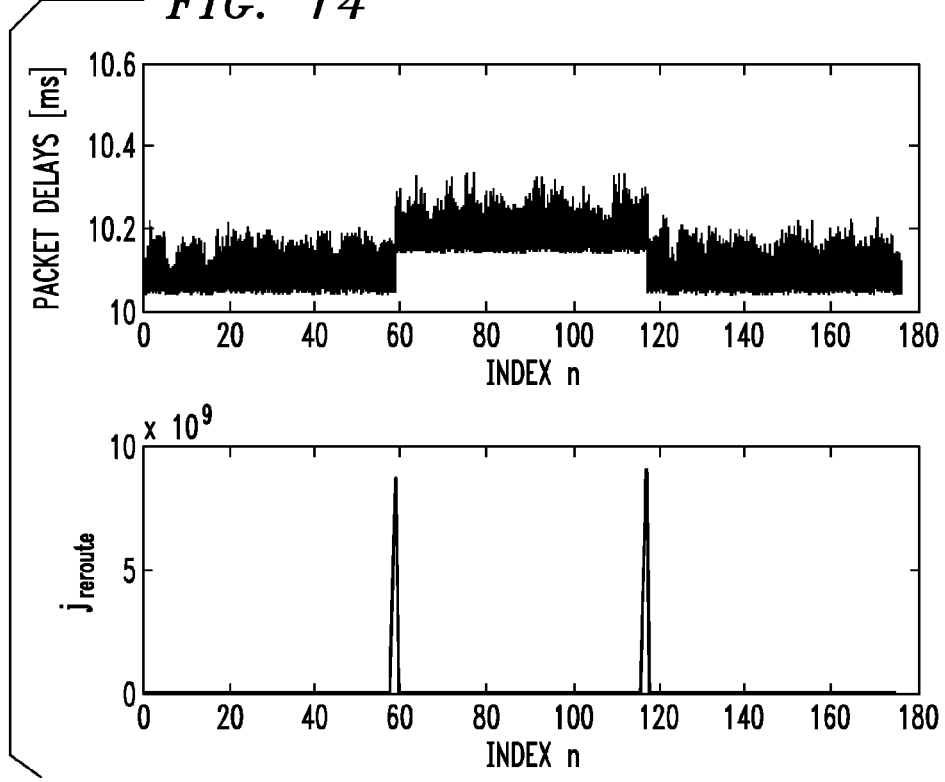
FIG. 14 illustrates a reroute discontinuity and corresponding detector signals.

FIG. 14 shows an example of a 100 microsecond reroute jump and the reroute jump detector signal. Again, the pulses associated with the jump are easily detectable and stand high compared to the noise.

The terms "congestion jump" and "reroute jump" are used above in conjunction with particular exemplary detectors to indicate the most likely cause of the particular jump type detected by the corresponding detector. However, this should not be construed as implying that the cause of every discontinuity detected by a given one of these detectors is necessarily due to a congestion condition or a reroute condition. The detectors described herein as congestion discontinuity detectors or reroute discontinuity detectors may each therefore detect discontinuities that result from network conditions other than respective congestion or reroute conditions. For example, there are network conditions that can cause the PDV floor to move in the face of congestion and if for example timing traffic priority is reduced by an operator action, one of the jump types noted above will be observed, although strictly speaking such an event is attributable to neither a congestion condition nor a reroute condition. Thus, there may be a variety of network conditions unrelated to congestion or reroute that cause the exemplary detectors described above to detect a discontinuity.

The above-described embodiments of the invention are intended to be illustrative only. As indicated previously, the invention is not restricted in terms of the particular configuration of the communication device in which it is implemented. Thus, a given communication device configured in accordance with the invention may include different arrangements of elements or other elements not explicitly shown or described. Also, alternative embodiments of the invention can utilize, for example, different communication system configurations, estimation and filtering processes, loop configurations, and timing messages than those described above in the context of the illustrative embodiments. Furthermore, the particular assumptions made in the course of describing the illustrative embodiments should not be viewed as requirements, and such assumptions need not apply in alternative embodiments. These and numerous other alternative embodiments within the scope of the following claims will be readily apparent to those skilled in the art.

What is claimed is:

1. An apparatus comprising:
a communication device comprising a clock recovery module;
the communication device being operative as a slave device relative to another communication device that is operative as a master device;
the clock recovery module comprising a clock recovery loop configured to control a slave clock frequency of the slave device so as to synchronize the slave clock frequency with a master clock frequency of the master device;
the clock recovery loop comprising:
a primary loop comprising a loop filter and a first frequency error estimator configured to generate a first estimate of error between the master clock frequency and the slave clock frequency;
a second frequency error estimator arranged outside of the primary loop and configured to generate a second estimate of error between the master clock frequency and the slave clock frequency; and
an accumulator coupled between the second frequency error estimator and the primary loop;
wherein the second estimate is controllably injected into the primary loop via the accumulator by combining an output of the accumulator with an output of the loop filter; and
wherein the first and second frequency error estimators independently generate the respective first and second estimates by processing arrival timestamps generated in the slave device for respective timing messages received from the master device.

2. The apparatus of claim 1 wherein the second estimate is generated by the second frequency error estimator for a given sample and the second estimate generated for the given sample is combined with the output of the accumulator from a previous sample prior to being injected into the primary loop at the output of the loop filter.

3. The apparatus of claim 1 wherein the second estimate is controllably injected into the primary loop only during an acquisition mode of the primary loop.

4. The apparatus of claim 1 wherein the second frequency error estimator has a lower accuracy than that of the primary loop but a time constant that is substantially smaller than a time constant of the primary loop such that the second frequency error estimator generates the second estimate before the primary loop converges to a steady state.

5. The apparatus of claim 1 wherein the second frequency error estimator comprises a linear time-variant system of two state variables given by time t and clock period T and wherein the linear time-variant system generates the second estimate as an estimate $\hat{t}$ of the time t and an estimate $\hat{T}$ of the clock period T.

6. The apparatus of claim 5 wherein the linear time-variant system comprises a Kalman filter.

7. The apparatus of claim 6 wherein the second frequency error estimator is configured to initialize the estimate $\hat{t}$ of the time t to an arrival timestamp generated in the slave device for a corresponding timing message received from the master device and to initialize the estimate $\hat{T}$ of the clock period T to a nominal master clock period.

8. The apparatus of claim 7 wherein for a given iteration of the second frequency error estimator associated with a particular one of a plurality of timing messages received from the master device, the second frequency error estimator calculates a predicted value $\bar{t}$ of a corresponding arrival timestamp as a sum of the time estimate and the master clock period estimate:

$$\bar{t}=\hat{t}+\hat{T}$$

where $\hat{t}$ and $\hat{T}$ are estimates from a previous iteration.

9. The apparatus of claim 8 wherein for the given iteration a prediction error $\alpha_p$ is calculated based on a corresponding arrival timestamp $T_s$ as follows:

$$\alpha_P=T_s-\bar{t}$$

and wherein new estimates of $\hat{t}$ and $\hat{T}$ are determined based on the prediction error and current values of Kalman filter gains.

10. The apparatus of claim 9 wherein after the new estimates of $\hat{t}$ and $\hat{T}$ are determined for the given iteration the values of the Kalman gains utilized in that iteration are updated for use in a subsequent iteration, and the updated values of the Kalman gains are utilized in determining estimates of $\hat{t}$ and $\hat{T}$ in the subsequent iteration.

11. The apparatus of claim 1 wherein the communication device comprises a processor coupled to a memory, and the clock recovery module is implemented at least in part in software code that is stored in the memory and executed by the processor.

12. An apparatus comprising:
a communication device comprising a clock recovery module;
the communication device being operative as a slave device relative to another communication device that is operative as a master device;
the clock recovery module comprising a clock recovery loop configured to control a slave clock frequency of the slave device so as to synchronize the slave clock frequency with a master clock frequency of the master device;
the clock recovery loop comprising:
a primary loop comprising a loop filter and a first frequency error estimator configured to generate a first estimate of error between the master clock frequency and the slave clock frequency;
a second frequency error estimator arranged outside of the primary loop and configured to generate a second estimate of error between the master clock frequency and the slave clock frequency; and
an accumulator coupled between the second frequency error estimator and the primary loop;
wherein the second estimate is controllably injected into the primary loop via the accumulator;
wherein the second frequency error estimator comprises a linear time-variant system of two state variables given by time t and clock period T and wherein the linear time-variant system generates the second estimate as an estimate $\hat{t}$ of the time t and an estimate $\hat{T}$ of the clock period T;
wherein the linear time-variant system comprises a Kalman filter;
wherein the second frequency error estimator is configured to initialize the estimate $\hat{t}$ of the time t to an arrival timestamp generated in the slave device for a corresponding timing message received from the master device and to initialize the estimate $\hat{T}$ of the clock period T to a nominal master clock period;
wherein for a given iteration of the second frequency error estimator associated with a particular one of a plurality of timing messages received from the master device, the second frequency error estimator calculates a predicted value $\bar{t}$ of a corresponding arrival timestamp as a sum of the time estimate and the master clock period estimate:

$$\bar{t}=\hat{t}+\hat{T}$$

where $\hat{t}$ and $\hat{T}$ are estimates from a previous iteration;
wherein for the given iteration a prediction error $\alpha_p$ is calculated based on a corresponding arrival timestamp $T_s$ as follows:

$$\alpha_P=T_s-\bar{t}$$

and wherein new estimates of $\hat{t}$ and $\hat{T}$ are determined based on the prediction error and current values of Kalman filter gains; and
wherein the new estimates of $\hat{t}$ and $\hat{T}$ are determined based on the prediction error and current values of Kalman filter gains as follows:

$$\hat{t}=\bar{t}+\alpha_p\cdot\tilde{P}_{11}$$

$$\hat{T}=\hat{T}+\alpha_p\cdot\tilde{P}_{12}$$

where $\tilde{P}_{11}$ and $\tilde{P}_{12}$ denote particular ones of the current values of the Kalman filter gains.

13. An apparatus comprising:
a communication device comprising a clock recovery module;
the communication device being operative as a slave device relative to another communication device that is operative as a master device;
the clock recovery module comprising a clock recovery loop configured to control a slave clock frequency of the slave device so as to synchronize the slave clock frequency with a master clock frequency of the master device;
the clock recovery loop comprising:
a primary loop comprising a loop filter and a first frequency error estimator configured to generate a first estimate of error between the master clock frequency and the slave clock frequency;
a second frequency error estimator arranged outside of the primary loop and configured to generate a second estimate of error between the master clock frequency and the slave clock frequency; and
an accumulator coupled between the second frequency error estimator and the primary loop;
wherein the second estimate is controllably injected into the primary loop via the accumulator;

wherein the second frequency error estimator comprises a linear time-variant system of two state variables given by time t and clock period T and wherein the linear time-variant system generates the second estimate as an estimate $\hat{t}$ of the time t and an estimate $\hat{T}$ of the clock period T;

wherein the second frequency error estimator is configured to initialize the estimate of the time t to an arrival timestamp generated in the slave device for a corresponding timing message received from the master device and to initialize the estimate $\hat{T}$ of the clock period T to a nominal master clock period; and wherein the second estimate to be injected into the primary loop is calculated from a converged estimated period $\hat{T}$ as follows:

$$1 - \hat{T}/T_{nominal}$$

where $T_{nominal}$ denotes the nominal master clock period.

14. A method for use in a communication device, the communication device being operative as a slave device relative to another communication device that is operative as a master device, the method comprising the steps of:
generating first and second estimates of error between a master clock frequency of the master device and a slave clock frequency of the slave device; and
controlling the slave clock frequency of the slave device based on the first and second error estimates to synchronize the slave clock frequency with the master clock frequency of the master device;
wherein the first estimate is generated in a primary clock recovery loop comprising a loop filter;
wherein the second estimate is generated external to the primary loop;
wherein the controlling step further comprises controllably injecting the second estimate into the primary loop via an accumulator by combining an output of the accumulator with an output of the loop filter; and
wherein the first and second estimates of error are independently generated by processing arrival timestamps generated in the slave device for respective timing messages received from the master device.

15. The method of claim 14 wherein the step of controllably injecting the second estimate into the primary loop further comprises injecting the second estimate into the primary loop only during an acquisition mode of the primary loop.

16. A non-transitory processor-readable storage medium having embodied therein executable program code that when executed by a processor of the communication device implements the steps of the method of claim 14.

17. A communication system, comprising:
at least first and second communication devices configured to communicate with one another over a packet network;
a first one of the communication devices being operative as a slave device relative to another one of the communication devices operative as a master device;
the first communication device comprising a clock recovery module;
the clock recovery module comprising a clock recovery loop configured to control a slave clock frequency of the slave device so as to synchronize the slave clock frequency with a master clock frequency of the master device;
the clock recovery loop comprising:
a primary loop comprising a loop filter and a first frequency error estimator configured to generate a first estimate of error between the master clock frequency and the slave clock frequency;
a second frequency error estimator arranged outside of the primary loop and configured to generate a second estimate of error between the master clock frequency and the slave clock frequency; and
an accumulator coupled between the second frequency error estimator and the primary loop;
wherein the second estimate is controllably injected into the primary loop via the accumulator by combining an output of the accumulator with an output of the loop filter; and
wherein the first and second frequency error estimators independently generate the respective first and second estimates by processing arrival timestamps generated in the slave device for respective timing messages received from the master device.

18. The system of claim 17 wherein at least one of the communication devices is operative in a first mode as a slave device and in a second mode as a master device.

* * * * *